United States Patent
Zaidy et al.

(10) Patent No.: US 12,094,531 B2
(45) Date of Patent: Sep. 17, 2024

(54) CACHING TECHNIQUES FOR DEEP LEARNING ACCELERATOR

(71) Applicant: Micron Technology, Inc., Boise, ID (US)

(72) Inventors: Aliasger Tayeb Zaidy, Seattle, WA (US); Patrick Alan Estep, Rowlett, TX (US); David Andrew Roberts, Wellesley, MA (US)

(73) Assignee: Micron Technology, Inc., Boise, ID (US)

( * ) Notice: Subject to any disclaimer, the term of this patent is extended or adjusted under 35 U.S.C. 154(b) by 922 days.

(21) Appl. No.: 17/146,314

(22) Filed: Jan. 11, 2021

(65) Prior Publication Data
US 2022/0223201 A1  Jul. 14, 2022

(51) Int. Cl.
| | |
|---|---|
| G06F 3/06 | (2006.01) |
| G06F 12/0862 | (2016.01) |
| G06F 12/0897 | (2016.01) |
| G06N 3/063 | (2023.01) |
| G06N 3/08 | (2023.01) |
| G11C 11/54 | (2006.01) |

(52) U.S. Cl.
CPC .......... *G11C 11/54* (2013.01); *G06F 12/0862* (2013.01); *G06F 12/0897* (2013.01); *G06N 3/063* (2013.01); *G06N 3/08* (2013.01)

(58) Field of Classification Search
CPC ..... G11C 11/54; G06F 12/0862; G06F 12/08; G06F 12/0897; G06F 12/00; G06N 3/063; G06N 3/08

See application file for complete search history.

(56) References Cited

U.S. PATENT DOCUMENTS

| | | | |
|---|---|---|---|
| 2016/0085585 A1 | 3/2016 | Chen et al. | |
| 2018/0157970 A1* | 6/2018 | Henry | ............ G06F 12/08 |
| 2019/0220734 A1 | 7/2019 | Ferdman et al. | |
| 2019/0384370 A1* | 12/2019 | Kim | ............ G06N 3/065 |
| 2020/0042859 A1 | 2/2020 | Mappouras et al. | |

(Continued)

FOREIGN PATENT DOCUMENTS

| | | | | |
|---|---|---|---|---|
| WO | WO-2016186801 A1 * | 11/2016 | ......... | G06F 15/8046 |
| WO | WO-2021206973 A1 * | 10/2021 | ......... | G06F 12/0813 |

OTHER PUBLICATIONS

International Search Report and Written Opinion, PCT/US2022/011459, mailed on Apr. 25, 2022.

*Primary Examiner* — Pierre Michel Bataille
(74) *Attorney, Agent, or Firm* — Greenberg Traurig

(57) ABSTRACT

Systems, devices, and methods related to a Deep Learning Accelerator and memory are described. For example, the accelerator can have processing units to perform at least matrix computations of an artificial neural network via execution of instructions. The processing units have a local memory store operands of the instructions. The accelerator can access a random access memory via a system buffer, or without going through the system buffer. A fetch instruction can request an item, available at a memory address in the random access memory, to be loaded into the local memory at a local address. The fetch instruction can include a hint for the caching of the item in the system buffer. During execution of the instruction, the hint can be used to determine whether to load the item through the system buffer or to bypass the system buffer in loading the item.

20 Claims, 12 Drawing Sheets

(56) References Cited

U.S. PATENT DOCUMENTS

| | | |
|---|---|---|
| 2020/0057938 A1 | 2/2020 | Lu et al. |
| 2020/0192811 A1 | 6/2020 | Harnik et al. |
| 2021/0048991 A1* | 2/2021 | Tanner ................. G06F 17/153 |
| 2021/0191724 A1* | 6/2021 | Pal ........................ G06F 9/3001 |
| 2021/0319821 A1* | 10/2021 | Kale ..................... G06F 9/3001 |

* cited by examiner

US 12,094,531 B2

CACHING TECHNIQUES FOR DEEP LEARNING ACCELERATOR

TECHNICAL FIELD

At least some embodiments disclosed herein relate to caching data in general and more particularly, but not limited to, caching data for processing by accelerators for Artificial Neural Networks (ANNs), such as ANNs configured through machine learning and/or deep learning.

BACKGROUND

An Artificial Neural Network (ANN) uses a network of neurons to process inputs to the network and to generate outputs from the network.

Deep learning has been applied to many application fields, such as computer vision, speech/audio recognition, natural language processing, machine translation, bioinformatics, drug design, medical image processing, games, etc.

BRIEF DESCRIPTION OF THE DRAWINGS

The embodiments are illustrated by way of example and not limitation in the figures of the accompanying drawings in which like references indicate similar elements.

DETAILED DESCRIPTION

Figure 1:
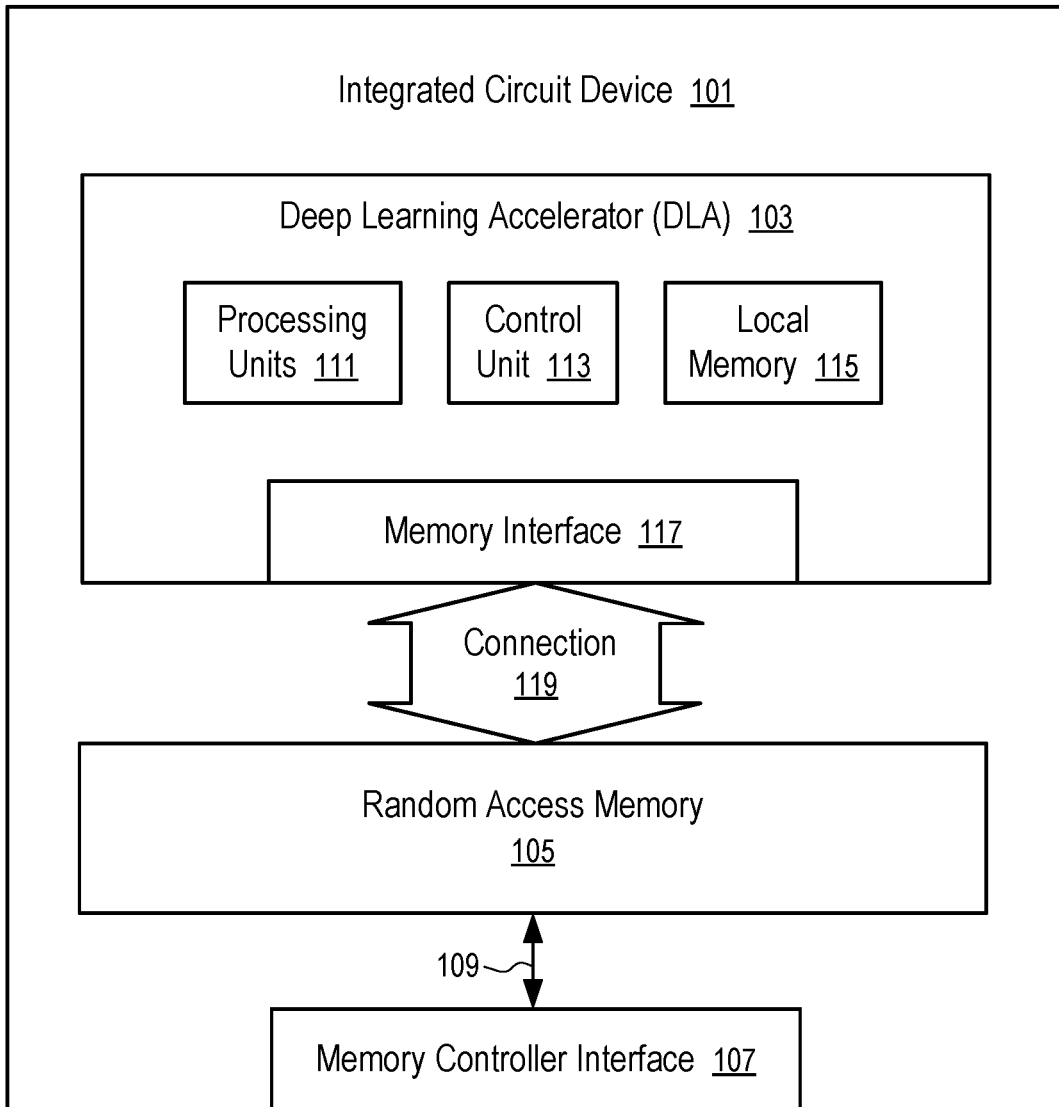
FIG. 1 shows an integrated circuit device having a Deep Learning Accelerator and random access memory configured according to one embodiment.

At least some embodiments disclosed herein provide a device configured to perform computations of Artificial Neural Networks (ANNs) with reduced energy consumption and computation time. The device includes a Deep Learning Accelerator (DLA), random access memory, and a system buffer. The Deep Learning Accelerator has local memory. The Deep Learning Accelerator can access the local memory faster than accessing the system buffer; and the Deep Learning Accelerator can access the system buffer faster than accessing the random access memory. Instructions to load data from the random access memory into the local memory can include hints on the type of the data and/or processing that will be applied in the Deep Learning Accelerator. Based on the hints the data loaded from the random access memory can be selectively cached in the system buffer or loaded without going through the system cache, in view of availability of storage capacity in the system buffer and/or the hinted priority of data that may be cached in the system buffer.

The Deep Learning Accelerator (DLA) includes a set of programmable hardware computing logic that is specialized and/or optimized to perform parallel vector and/or matrix calculations, including but not limited to multiplication and accumulation of vectors and/or matrices.

Further, the Deep Learning Accelerator (DLA) can include one or more Arithmetic-Logic Units (ALUs) to perform arithmetic and bitwise operations on integer binary numbers.

The Deep Learning Accelerator (DLA) is programmable via a set of instructions to perform the computations of an Artificial Neural Network (ANN).

For example, each neuron in the ANN receives a set of inputs. Some of the inputs to a neuron can be the outputs of certain neurons in the ANN; and some of the inputs to a neuron can be the inputs provided to the ANN. The input/output relations among the neurons in the ANN represent the neuron connectivity in the ANN.

For example, each neuron can have a bias, an activation function, and a set of synaptic weights for its inputs respectively. The activation function can be in the form of a step function, a linear function, a log-sigmoid function, etc. Different neurons in the ANN can have different activation functions.

For example, each neuron can generate a weighted sum of its inputs and its bias and then produce an output that is the function of the weighted sum, computed using the activation function of the neuron.

The relations between the input(s) and the output(s) of an ANN in general are defined by an ANN model that includes the data representing the connectivity of the neurons in the ANN, as well as the bias, activation function, and synaptic weights of each neuron. Based on a given ANN model, a computing device can be configured to compute the output(s) of the ANN from a given set of inputs to the ANN.

For example, the inputs to the ANN can be generated based on camera inputs; and the outputs from the ANN can be the identification of an item, such as an event or an object.

In general, an ANN can be trained using a supervised method where the parameters in the ANN are adjusted to minimize or reduce the error between known outputs associated with or resulted from respective inputs and computed outputs generated via applying the inputs to the ANN. Examples of supervised learning/training methods include reinforcement learning and learning with error correction.

Alternatively, or in combination, an ANN can be trained using an unsupervised method where the exact outputs resulted from a given set of inputs is not known before the completion of the training. The ANN can be trained to classify an item into a plurality of categories, or data points into clusters.

Multiple training algorithms can be employed for a sophisticated machine learning/training paradigm.

Deep learning uses multiple layers of machine learning to progressively extract features from input data. For example, lower layers can be configured to identify edges in an image; and higher layers can be configured to identify, based on the edges detected using the lower layers, items captured in the image, such as faces, objects, events, etc. Deep learning can be implemented via Artificial Neural Networks (ANNs), such as deep neural networks, deep belief networks, recurrent neural networks, and/or convolutional neural networks.

The granularity of the Deep Learning Accelerator (DLA) operating on vectors and matrices corresponds to the largest unit of vectors/matrices that can be operated upon during the execution of one instruction by the Deep Learning Accelerator (DLA). During the execution of the instruction for a predefined operation on vector/matrix operands, elements of vector/matrix operands can be operated upon by the Deep Learning Accelerator (DLA) in parallel to reduce execution time and/or energy consumption associated with memory/data access. The operations on vector/matrix operands of the granularity of the Deep Learning Accelerator (DLA) can be used as building blocks to implement computations on vectors/matrices of larger sizes.

The implementation of a typical/practical Artificial Neural Network (ANN) involves vector/matrix operands having sizes that are larger than the operation granularity of the Deep Learning Accelerator (DLA). To implement such an Artificial Neural Network (ANN) using the Deep Learning Accelerator (DLA), computations involving the vector/matrix operands of large sizes can be broken down to the computations of vector/matrix operands of the granularity of the Deep Learning Accelerator (DLA). The Deep Learning Accelerator (DLA) can be programmed via instructions to carry out the computations involving large vector/matrix operands. For example, atomic computation capabilities of the Deep Learning Accelerator (DLA) in manipulating vectors and matrices of the granularity of the Deep Learning Accelerator (DLA) in response to instructions can be programmed to implement computations in an Artificial Neural Network (ANN).

In some implementations, the Deep Learning Accelerator (DLA) lacks some of the logic operation capabilities of a typical Central Processing Unit (CPU). However, the Deep Learning Accelerator (DLA) can be configured with sufficient logic units to process the input data provided to an Artificial Neural Network (ANN) and generate the output of the Artificial Neural Network (ANN) according to a set of instructions generated for the Deep Learning Accelerator (DLA). Thus, the Deep Learning Accelerator (DLA) can perform the computation of an Artificial Neural Network (ANN) with little or no help from a Central Processing Unit (CPU) or another processor. Optionally, a conventional general purpose processor can also be configured as part of the Deep Learning Accelerator (DLA) to perform operations that cannot be implemented efficiently using the vector/matrix processing units of the Deep Learning Accelerator (DLA), and/or that cannot be performed by the vector/matrix processing units of the Deep Learning Accelerator (DLA).

A typical Artificial Neural Network (ANN) can be described/specified in a standard format (e.g., Open Neural Network Exchange (ONNX)). A compiler can be used to convert the description of the Artificial Neural Network (ANN) into a set of instructions for the Deep Learning Accelerator (DLA) to perform calculations of the Artificial Neural Network (ANN). The compiler can optimize the set of instructions to improve the performance of the Deep Learning Accelerator (DLA) in implementing the Artificial Neural Network (ANN).

The Deep Learning Accelerator (DLA) can have local memory, such as registers, buffers and/or caches, configured to store vector/matrix operands and the results of vector/matrix operations. Intermediate results in the registers can be pipelined/shifted in the Deep Learning Accelerator (DLA) as operands for subsequent vector/matrix operations to reduce time and energy consumption in accessing memory/data and thus speed up typical patterns of vector/matrix operations in implementing a typical Artificial Neural Network (ANN). The capacity of registers, buffers and/or caches in the Deep Learning Accelerator (DLA) is typically insufficient to hold the entire data set for implementing the computation of a typical Artificial Neural Network (ANN). Thus, a random access memory coupled to the Deep Learning Accelerator (DLA) is configured to provide an improved data storage capability for implementing a typical Artificial Neural Network (ANN). For example, the Deep Learning Accelerator (DLA) loads data and instructions from the random access memory and stores results back into the random access memory.

The communication bandwidth between the Deep Learning Accelerator (DLA) and the random access memory is configured to optimize or maximize the utilization of the computation power of the Deep Learning Accelerator (DLA). For example, high communication bandwidth can be provided between the Deep Learning Accelerator (DLA) and the random access memory such that vector/matrix operands can be loaded from the random access memory into the Deep Learning Accelerator (DLA) and results stored back into the random access memory in a time period that is approximately equal to the time for the Deep Learning Accelerator (DLA) to perform the computations on the vector/matrix operands. The granularity of the Deep Learning Accelerator (DLA) can be configured to increase the ratio between the amount of computations performed by the Deep Learning Accelerator (DLA) and the size of the vector/matrix operands such that the data access traffic between the Deep Learning Accelerator (DLA) and the random access memory can be reduced, which can reduce the requirement on the communication bandwidth between the Deep Learning Accelerator (DLA) and the random access memory. Thus, the bottleneck in data/memory access can be reduced or eliminated.

FIG. 1 shows an integrated circuit device 101 having a Deep Learning Accelerator 103 and random access memory 105 configured according to one embodiment.

The Deep Learning Accelerator 103 in FIG. 1 includes processing units 111, a control unit 113, and local memory 115. When vector and matrix operands are in the local memory 115, the control unit 113 can use the processing units 111 to perform vector and matrix operations in accordance with instructions. Further, the control unit 113 can load instructions and operands from the random access memory 105 through a memory interface 117 and a high speed/bandwidth connection 119.

The integrated circuit device 101 is configured to be enclosed within an integrated circuit package with pins or contacts for a memory controller interface 107.

The memory controller interface 107 is configured to support a standard memory access protocol such that the integrated circuit device 101 appears to a typical memory controller in a way same as a conventional random access memory device having no Deep Learning Accelerator 103. For example, a memory controller external to the integrated circuit device 101 can access, using a standard memory access protocol through the memory controller interface 107, the random access memory 105 in the integrated circuit device 101.

The integrated circuit device 101 is configured with a high bandwidth connection 119 between the random access memory 105 and the Deep Learning Accelerator 103 that are enclosed within the integrated circuit device 101. The bandwidth of the connection 119 is higher than the bandwidth of the connection 109 between the random access memory 105 and the memory controller interface 107.

In one embodiment, both the memory controller interface 107 and the memory interface 117 are configured to access the random access memory 105 via a same set of buses or wires. Thus, the bandwidth to access the random access memory 105 is shared between the memory interface 117 and the memory controller interface 107. Alternatively, the memory controller interface 107 and the memory interface 117 are configured to access the random access memory 105 via separate sets of buses or wires. Optionally, the random access memory 105 can include multiple sections that can be accessed concurrently via the connection 119. For example, when the memory interface 117 is accessing a section of the random access memory 105, the memory controller interface 107 can concurrently access another section of the random access memory 105. For example, the different sections can be configured on different integrated circuit dies and/or different planes/banks of memory cells; and the different sections can be accessed in parallel to increase throughput in accessing the random access memory 105. For example, the memory controller interface 107 is configured to access one data unit of a predetermined size at a time; and the memory interface 117 is configured to access multiple data units, each of the same predetermined size, at a time.

In one embodiment, the random access memory 105 and the integrated circuit device 101 are configured on different integrated circuit dies configured within a same integrated circuit package. Further, the random access memory 105 can be configured on one or more integrated circuit dies that allows parallel access of multiple data elements concurrently.

In some implementations, the number of data elements of a vector or matrix that can be accessed in parallel over the connection 119 corresponds to the granularity of the Deep Learning Accelerator (DLA) operating on vectors or matrices. For example, when the processing units 111 can be operated on a number of vector/matrix elements in parallel, the connection 119 is configured to load or store the same number, or multiples of the number, of elements via the connection 119 in parallel.

Optionally, the data access speed of the connection 119 can be configured based on the processing speed of the Deep Learning Accelerator 103. For example, after an amount of data and instructions have been loaded into the local memory 115, the control unit 113 can execute an instruction to operate on the data using the processing units 111 to generate output. Within the time period of processing to generate the output, the access bandwidth of the connection 119 allows the same amount of data and instructions to be loaded into the local memory 115 for the next operation and the same amount of output to be stored back to the random access memory 105. For example, while the control unit 113 is using a portion of the local memory 115 to process data and generate output, the memory interface 117 can offload the output of a prior operation into the random access memory 105 from, and load operand data and instructions into, another portion of the local memory 115. Thus, the utilization and performance of the Deep Learning Accelerator (DLA) are not restricted or reduced by the bandwidth of the connection 119.

The random access memory 105 can be used to store the model data of an Artificial Neural Network (ANN) and to buffer input data for the Artificial Neural Network (ANN). The model data does not change frequently. The model data can include the output generated by a compiler for the Deep Learning Accelerator (DLA) to implement the Artificial Neural Network (ANN). The model data typically includes matrices used in the description of the Artificial Neural Network (ANN) and instructions generated for the Deep Learning Accelerator 103 to perform vector/matrix operations of the Artificial Neural Network (ANN) based on vector/matrix operations of the granularity of the Deep Learning Accelerator 103. The instructions operate not only on the vector/matrix operations of the Artificial Neural Network (ANN), but also on the input data for the Artificial Neural Network (ANN).

In one embodiment, when the input data is loaded or updated in the random access memory 105, the control unit 113 of the Deep Learning Accelerator 103 can automatically execute the instructions for the Artificial Neural Network (ANN) to generate an output of the Artificial Neural Network (ANN). The output is stored into a predefined region in the random access memory 105. The Deep Learning Accelerator 103 can execute the instructions without help from a Central Processing Unit (CPU). Thus, communications for the coordination between the Deep Learning Accelerator 103 and a processor outside of the integrated circuit device 101 (e.g., a Central Processing Unit (CPU)) can be reduced or eliminated.

Optionally, the logic circuit of the Deep Learning Accelerator 103 can be implemented via Complementary Metal Oxide Semiconductor (CMOS). For example, the technique of CMOS Under the Array (CUA) of memory cells of the random access memory 105 can be used to implement the logic circuit of the Deep Learning Accelerator 103, including the processing units 111 and the control unit 113. Alternatively, the technique of CMOS in the Array of memory cells of the random access memory 105 can be used to implement the logic circuit of the Deep Learning Accelerator 103.

In some implementations, the Deep Learning Accelerator 103 and the random access memory 105 can be implemented on separate integrated circuit dies and connected using Through-Silicon Vias (TSV) for increased data bandwidth between the Deep Learning Accelerator 103 and the random access memory 105. For example, the Deep Learning Accelerator 103 can be formed on an integrated circuit die of a Field-Programmable Gate Array (FPGA) or Application Specific Integrated circuit (ASIC).

Alternatively, the Deep Learning Accelerator 103 and the random access memory 105 can be configured in separate integrated circuit packages and connected via multiple point-to-point connections on a printed circuit board (PCB) for parallel communications and thus increased data transfer bandwidth.

The random access memory 105 can be volatile memory or non-volatile memory, or a combination of volatile memory and non-volatile memory. Examples of non-volatile memory include flash memory, memory cells formed based on negative-and (NAND) logic gates, negative-or (NOR) logic gates, Phase-Change Memory (PCM), magnetic memory (MRAM), resistive random-access memory, cross point storage and memory devices. A cross point memory device can use transistor-less memory elements, each of which has a memory cell and a selector that are stacked together as a column. Memory element columns are connected via two layers of wires running in perpendicular directions, where wires of one layer run in one direction in the layer that is located above the memory element columns, and wires of the other layer run in another direction and are located below the memory element columns. Each memory element can be individually selected at a cross point of one wire on each of the two layers. Cross point memory devices are fast and non-volatile and can be used as a unified memory pool for processing and storage. Further examples of non-volatile memory include Read-Only Memory (ROM), Programmable Read-Only Memory (PROM), Erasable Programmable Read-Only Memory (EPROM) and Electronically Erasable Programmable Read-Only Memory (EEPROM) memory, etc. Examples of volatile memory include Dynamic Random-Access Memory (DRAM) and Static Random-Access Memory (SRAM).

For example, non-volatile memory can be configured to implement at least a portion of the random access memory 105. The non-volatile memory in the random access memory 105 can be used to store the model data of an Artificial Neural Network (ANN). Thus, after the integrated circuit device 101 is powered off and restarts, it is not necessary to reload the model data of the Artificial Neural Network (ANN) into the integrated circuit device 101. Further, the non-volatile memory can be programmable/rewritable. Thus, the model data of the Artificial Neural Network (ANN) in the integrated circuit device 101 can be updated or replaced to implement an update Artificial Neural Network (ANN), or another Artificial Neural Network (ANN).

The processing units 111 of the Deep Learning Accelerator 103 can include vector-vector units, matrix-vector units, and/or matrix-matrix units. Examples of units configured to perform for vector-vector operations, matrix-vector operations, and matrix-matrix operations are discussed below in connection with FIGS. 2-4.

Figure 2:
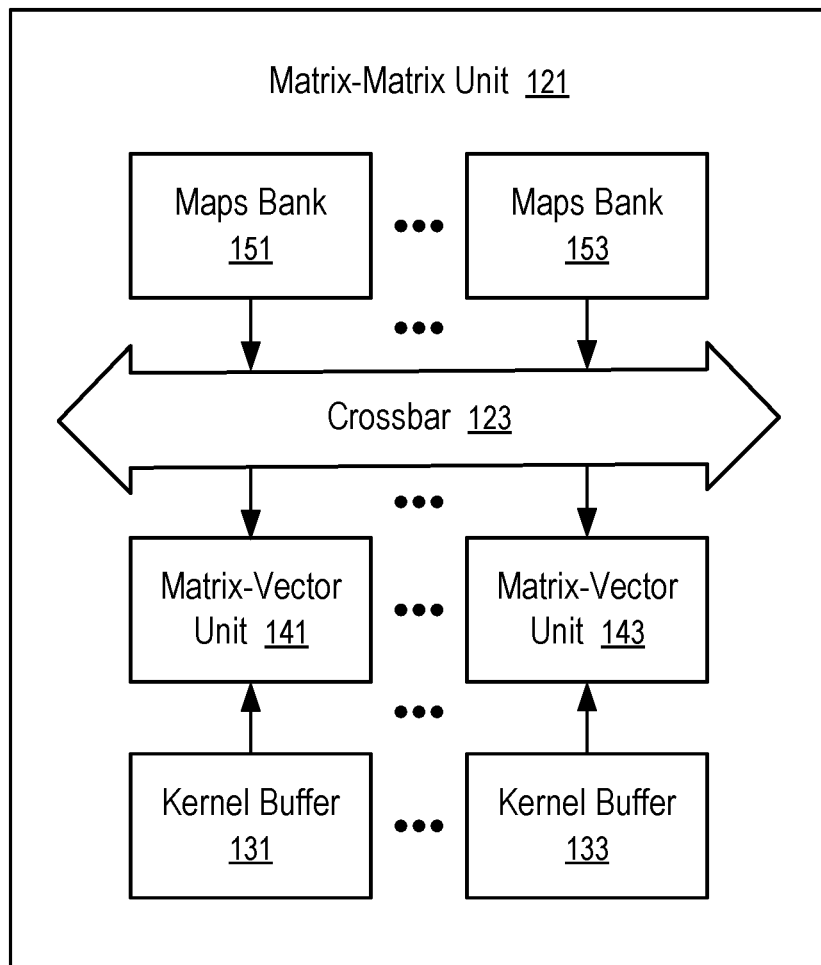
FIG. 2 shows a processing unit configured to perform matrix-matrix operations according to one embodiment.

FIG. 2 shows a processing unit configured to perform matrix-matrix operations according to one embodiment. For example, the matrix-matrix unit 121 of FIG. 2 can be used as one of the processing units 111 of the Deep Learning Accelerator 103 of FIG. 1.

In FIG. 2, the matrix-matrix unit 121 includes multiple kernel buffers 131 to 133 and multiple the maps banks 151 to 153. Each of the maps banks 151 to 153 stores one vector of a matrix operand that has multiple vectors stored in the maps banks 151 to 153 respectively; and each of the kernel buffers 131 to 133 stores one vector of another matrix operand that has multiple vectors stored in the kernel buffers 131 to 133 respectively. The matrix-matrix unit 121 is configured to perform multiplication and accumulation operations on the elements of the two matrix operands, using multiple matrix-vector units 141 to 143 that operate in parallel.

A crossbar 123 connects the maps banks 151 to 153 to the matrix-vector units 141 to 143. The same matrix operand stored in the maps bank 151 to 153 is provided via the crossbar 123 to each of the matrix-vector units 141 to 143; and the matrix-vector units 141 to 143 receives data elements from the maps banks 151 to 153 in parallel. Each of the kernel buffers 131 to 133 is connected to a respective one in the matrix-vector units 141 to 143 and provides a vector operand to the respective matrix-vector unit. The matrix-vector units 141 to 143 operate concurrently to compute the operation of the same matrix operand, stored in the maps banks 151 to 153 multiplied by the corresponding vectors stored in the kernel buffers 131 to 133. For example, the matrix-vector unit 141 performs the multiplication operation on the matrix operand stored in the maps banks 151 to 153 and the vector operand stored in the kernel buffer 131, while the matrix-vector unit 143 is concurrently performing the multiplication operation on the matrix operand stored in the maps banks 151 to 153 and the vector operand stored in the kernel buffer 133.

Figure 3:
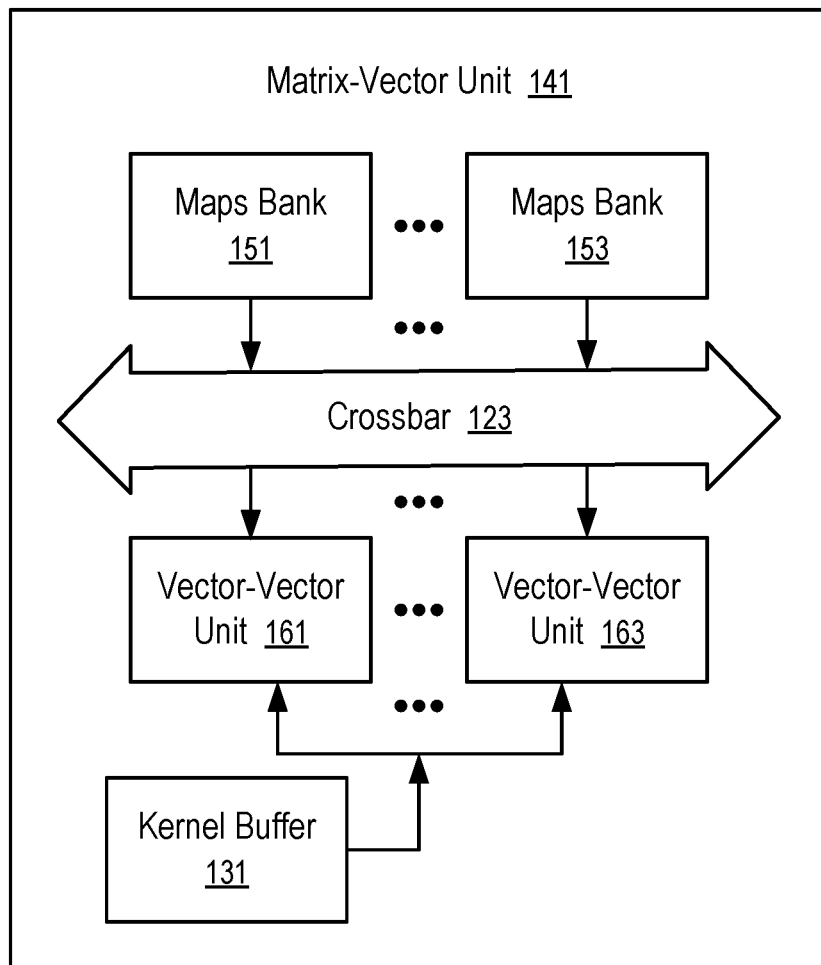
FIG. 3 shows a processing unit configured to perform matrix-vector operations according to one embodiment.

Each of the matrix-vector units 141 to 143 in FIG. 2 can be implemented in a way as illustrated in FIG. 3.

FIG. 3 shows a processing unit configured to perform matrix-vector operations according to one embodiment. For example, the matrix-vector unit 141 of FIG. 3 can be used as any of the matrix-vector units in the matrix-matrix unit 121 of FIG. 2.

In FIG. 3, each of the maps banks 151 to 153 stores one vector of a matrix operand that has multiple vectors stored in the maps banks 151 to 153 respectively, in a way similar to the maps banks 151 to 153 of FIG. 2. The crossbar 123 in FIG. 3 provides the vectors from the maps banks 151 to the vector-vector units 161 to 163 respectively. A same vector stored in the kernel buffer 131 is provided to the vector-vector units 161 to 163.

The vector-vector units 161 to 163 operate concurrently to compute the operation of the corresponding vector operands, stored in the maps banks 151 to 153 respectively, multiplied by the same vector operand that is stored in the kernel buffer 131. For example, the vector-vector unit 161 performs the multiplication operation on the vector operand stored in the maps bank 151 and the vector operand stored in the kernel buffer 131, while the vector-vector unit 163 is concurrently performing the multiplication operation on the vector operand stored in the maps bank 153 and the vector operand stored in the kernel buffer 131.

When the matrix-vector unit 141 of FIG. 3 is implemented in a matrix-matrix unit 121 of FIG. 2, the matrix-vector unit 141 can use the maps banks 151 to 153, the crossbar 123 and the kernel buffer 131 of the matrix-matrix unit 121.

Figure 4:
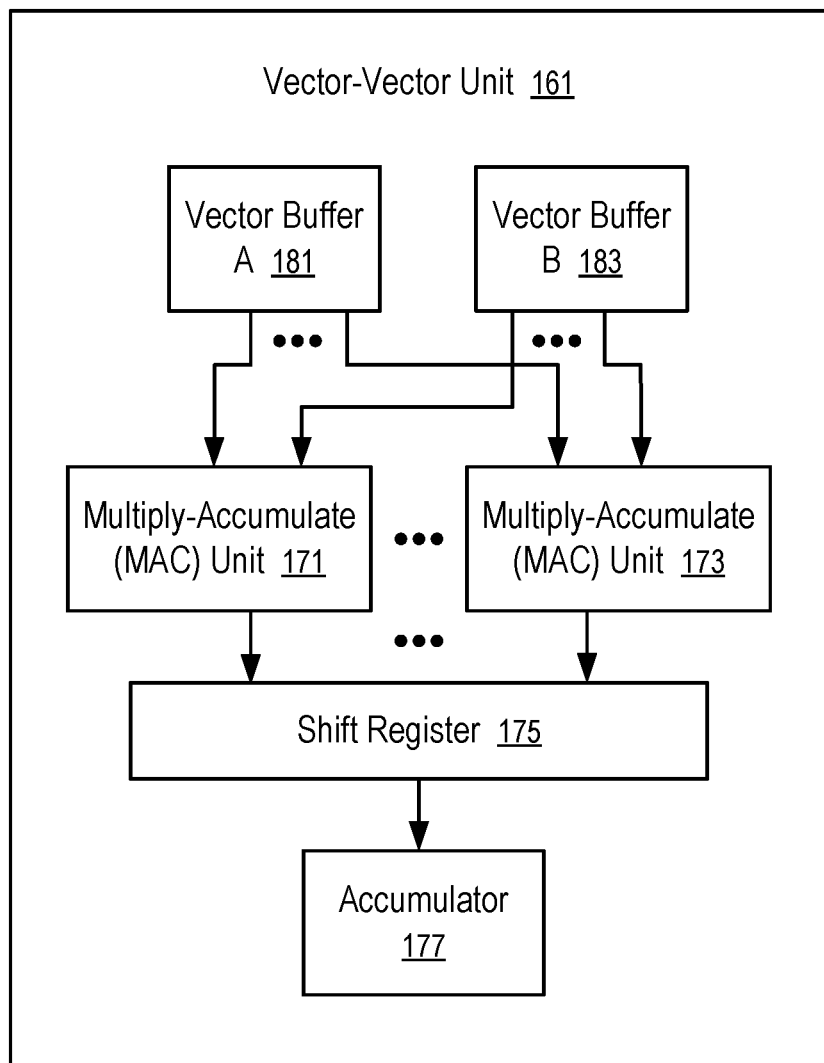
FIG. 4 shows a processing unit configured to perform vector-vector operations according to one embodiment.

Each of the vector-vector units 161 to 163 in FIG. 3 can be implemented in a way as illustrated in FIG. 4.

FIG. 4 shows a processing unit configured to perform vector-vector operations according to one embodiment. For example, the vector-vector unit 161 of FIG. 4 can be used as any of the vector-vector units in the matrix-vector unit 141 of FIG. 3.

In FIG. 4, the vector-vector unit 161 has multiple multiply-accumulate units 171 to 173. Each of the multiply-accumulate units 171 to 173 can receive two numbers as operands, perform multiplication of the two numbers, and add the result of the multiplication to a sum maintained in the multiply-accumulate (MAC) unit.

Each of the vector buffers 181 and 183 stores a list of numbers. A pair of numbers, each from one of the vector buffers 181 and 183, can be provided to each of the multiply-accumulate units 171 to 173 as input. The multiply-accumulate units 171 to 173 can receive multiple pairs of numbers from the vector buffers 181 and 183 in parallel and perform the multiply-accumulate (MAC) operations in parallel. The outputs from the multiply-accumulate units 171 to 173 are stored into the shift register 175; and an accumulator 177 computes the sum of the results in the shift register 175.

When the vector-vector unit 161 of FIG. 4 is implemented in a matrix-vector unit 141 of FIG. 3, the vector-vector unit 161 can use a maps bank (e.g., 151 or 153) as one vector buffer 181, and the kernel buffer 131 of the matrix-vector unit 141 as another vector buffer 183.

The vector buffers 181 and 183 can have a same length to store the same number/count of data elements. The length can be equal to, or the multiple of, the count of multiply-accumulate units 171 to 173 in the vector-vector unit 161. When the length of the vector buffers 181 and 183 is the multiple of the count of multiply-accumulate units 171 to 173, a number of pairs of inputs, equal to the count of the multiply-accumulate units 171 to 173, can be provided from the vector buffers 181 and 183 as inputs to the multiply-accumulate units 171 to 173 in each iteration; and the vector buffers 181 and 183 feed their elements into the multiply-accumulate units 171 to 173 through multiple iterations.

In one embodiment, the communication bandwidth of the connection 119 between the Deep Learning Accelerator 103 and the random access memory 105 is sufficient for the matrix-matrix unit 121 to use portions of the random access memory 105 as the maps banks 151 to 153 and the kernel buffers 131 to 133.

In another embodiment, the maps banks 151 to 153 and the kernel buffers 131 to 133 are implemented in a portion of the local memory 115 of the Deep Learning Accelerator 103. The communication bandwidth of the connection 119 between the Deep Learning Accelerator 103 and the random access memory 105 is sufficient to load, into another portion of the local memory 115, matrix operands of the next operation cycle of the matrix-matrix unit 121, while the matrix-matrix unit 121 is performing the computation in the current operation cycle using the maps banks 151 to 153 and the kernel buffers 131 to 133 implemented in a different portion of the local memory 115 of the Deep Learning Accelerator 103.

Figure 5:
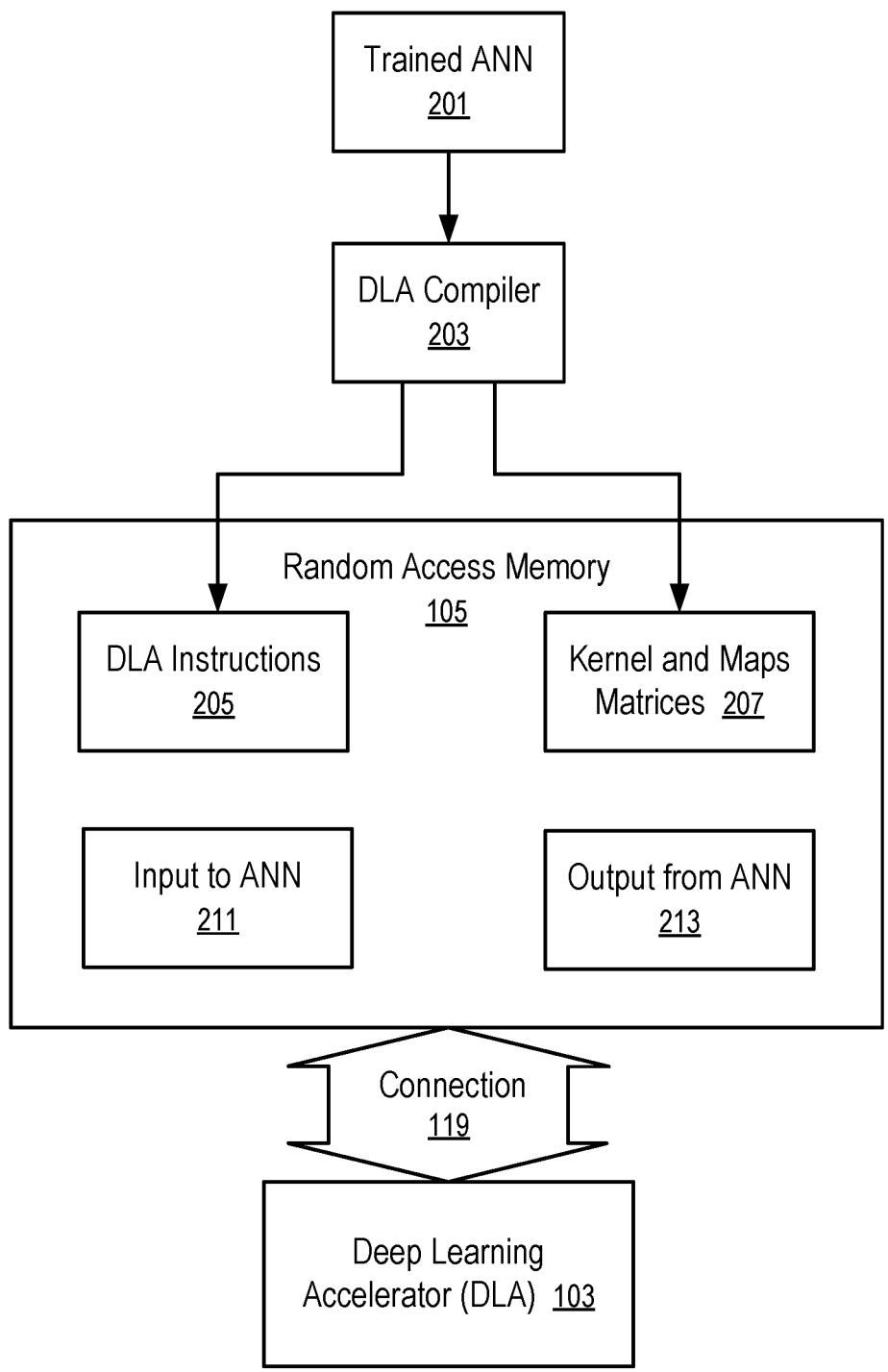
FIG. 5 shows a Deep Learning Accelerator and random access memory configured to autonomously apply inputs to a trained Artificial Neural Network according to one embodiment.

FIG. 5 shows a Deep Learning Accelerator and random access memory configured to autonomously apply inputs to a trained Artificial Neural Network according to one embodiment.

An Artificial Neural Network (ANN) 201 that has been trained through machine learning (e.g., deep learning) can be described in a standard format (e.g., Open Neural Network Exchange (ONNX)). The description of the trained Artificial Neural Network 201 in the standard format identifies the properties of the artificial neurons and their connectivity.

In FIG. 5, a Deep Learning Accelerator (DLA) compiler 203 converts trained Artificial Neural Network 201 by generating instructions 205 for a Deep Learning Accelerator 103 and matrices 207 corresponding to the properties of the artificial neurons and their connectivity. The instructions 205 and the matrices 207 generated by the DLA compiler 203 from the trained Artificial Neural Network 201 can be stored in random access memory 105 for the Deep Learning Accelerator 103.

For example, the random access memory 105 and the Deep Learning Accelerator 103 can be connected via a high bandwidth connection 119 in a way as in the integrated circuit device 101 of FIG. 1. The autonomous computation of FIG. 5 based on the instructions 205 and the matrices 207 can be implemented in the integrated circuit device 101 of FIG. 1. Alternatively, the random access memory 105 and the Deep Learning Accelerator 103 can be configured on a printed circuit board with multiple point to point serial buses running in parallel to implement the connection 119.

In FIG. 5, after the results of the DLA compiler 203 are stored in the random access memory 105, the application of the trained Artificial Neural Network 201 to process an input 211 to the trained Artificial Neural Network 201 to generate the corresponding output 213 of the trained Artificial Neural Network 201 can be triggered by the presence of the input 211 in the random access memory 105, or another indication provided in the random access memory 105.

In response, the Deep Learning Accelerator 103 executes the instructions 205 to combine the input 211 and the matrices 207. The execution of the instructions 205 can include the generation of maps matrices for the maps banks 151 to 153 of one or more matrix-matrix units (e.g., 121) of the Deep Learning Accelerator 103.

In some embodiments, the inputs 211 to the Artificial Neural Network 201 is in the form of an initial maps matrix. Portions of the initial maps matrix can be retrieved from the random access memory 105 as the matrix operand stored in the maps banks 151 to 153 of a matrix-matrix unit 121. Alternatively, the DLA instructions 205 also include instructions for the Deep Learning Accelerator 103 to generate the initial maps matrix from the input 211.

According to the DLA instructions 205, the Deep Learning Accelerator 103 loads matrix operands into the kernel buffers 131 to 133 and maps banks 151 to 153 of its matrix-matrix unit 121. The matrix-matrix unit 121 performs the matrix computation on the matrix operands. For example, the DLA instructions 205 break down matrix computations of the trained Artificial Neural Network 201 according to the computation granularity of the Deep Learning Accelerator 103 (e.g., the sizes/dimensions of matrices that loaded as matrix operands in the matrix-matrix unit 121) and applies the input feature maps to the kernel of a layer of artificial neurons to generate output as the input for the next layer of artificial neurons.

Upon completion of the computation of the trained Artificial Neural Network 201 performed according to the instructions 205, the Deep Learning Accelerator 103 stores the output 213 of the Artificial Neural Network 201 at a pre-defined location in the random access memory 105, or at a location specified in an indication provided in the random access memory 105 to trigger the computation.

When the technique of FIG. 5 is implemented in the integrated circuit device 101 of FIG. 1, an external device connected to the memory controller interface 107 can write the input 211 into the random access memory 105 and trigger the autonomous computation of applying the input 211 to the trained Artificial Neural Network 201 by the Deep Learning Accelerator 103. After a period of time, the output 213 is available in the random access memory 105; and the external device can read the output 213 via the memory controller interface 107 of the integrated circuit device 101.

For example, a predefined location in the random access memory 105 can be configured to store an indication to trigger the autonomous execution of the instructions 205 by the Deep Learning Accelerator 103. The indication can optionally include a location of the input 211 within the random access memory 105. Thus, during the autonomous execution of the instructions 205 to process the input 211, the external device can retrieve the output generated during a previous run of the instructions 205, and/or store another set of input for the next run of the instructions 205.

Optionally, a further predefined location in the random access memory 105 can be configured to store an indication of the progress status of the current run of the instructions 205. Further, the indication can include a prediction of the completion time of the current run of the instructions 205 (e.g., estimated based on a prior run of the instructions 205). Thus, the external device can check the completion status at a suitable time window to retrieve the output 213.

In some embodiments, the random access memory 105 is configured with sufficient capacity to store multiple sets of inputs (e.g., 211) and outputs (e.g., 213). Each set can be configured in a predetermined slot/area in the random access memory 105.

The Deep Learning Accelerator 103 can execute the instructions 205 autonomously to generate the output 213 from the input 211 according to matrices 207 stored in the random access memory 105 without helps from a processor or device that is located outside of the integrated circuit device 101.

A computing system having the Deep Learning Accelerator 103 can have different sources of memory accesses with different access patterns. Some are more amenable to caching than others for performance improvement.

At least some embodiments disclosed herein provide techniques to intelligently bypass caching data in a system buffer for specific data that is loaded into the local memory 115 of the Deep Learning Accelerator 103. For example, data being loaded from the random access memory 105 into the local memory 115 of the Deep Learning Accelerator 103 can be instructions 205, matrices 207 representative of a portion of an Artificial Neural Network 201, input 211 to and output 213 from portions of the Artificial Neural Network 201. Different types of data can have different access patterns. The data type and/or caching preferences can be specified as hints in instructions to load respective data from the random access memory 105 into the local memory 115. The hints can be used to prioritize caching of data in the system buffer to increase performance by reducing conflict/capacity misses and consequently increasing the cache hit rate for the system buffer configured for the Deep Learning Accelerator 103.

The computing performance of the Deep Learning Accelerator 103 is often limited by the memory bandwidth available. One or several system buffers can be used to exploit spatial and temporal locality in the computing workload of an Artificial Neural Network 201, such as a Deep Neural Network (DNN).

For example, a system buffer can be configured in an integrated circuit die of the Deep Learning Accelerator 103, or another integrated circuit die, to function as cache memory for accessing the random access memory 105. A data item loaded from the random access memory 105 can be cached in the system buffer such that when a subsequent instruction is configured to load the data item for processing the Deep Learning Accelerator 103, the data item cached in the system buffer can be used to fulfill the data request. Since accessing the system buffer is faster than accessing the random access memory 105, the use of the data item cached in the system buffer can improve the performance of the Deep Learning Accelerator 103.

However, the capability of the system buffer is smaller than the capacity of the random access memory 105. Thus, caching data in the system buffer that is more likely to be reused in subsequent instructions 205 can improve the computing performance of the Deep Learning Accelerator 103, in comparison with caching other data that is less likely to be reused in subsequent instructions 205.

A Deep Neural Network (DNN) can have several layers of artificial neurons cascaded together. Out of the data used to process these layers, instructions are typically not reused; and depending on the algorithm/computing method used in implementing the computation of the Deep Neural Network (DNN), either kernel or maps/layer data may be fetched just once from the random access memory 105 and reused in the local memory of the Deep Learning Accelerator 103. If such data or instructions are cached in the system buffer, it may result in the eviction of other data that might be reused subsequently and effectively increase the cache miss rate of the system buffer. The increased cache miss rate can result in increased latency in loading data into the local memory 115 for processing and thus decreased performance across the computing system/device. Such unnecessary evictions can be avoided by allowing certain data to bypass the system buffer and be fetched directly to the local memory 115 of the processing units 111. The local memory 115 can be register files and/or local Static Random-Access Memory (SRAM) of the processing units 111. A hint of the data type of items to be fetched from the random access memory 105 and/or how the item is to be used in the Deep Learning Accelerator 103 can be provided by the compiler 203 in an instruction configured to request the loading of a data item into the local memory 115. The hint allows the selectively caching or not-caching of the data item based on future scope of reusability and consequently avoid wasted memory bandwidth. The technique can result in significant reduction in memory bandwidth usage and power for processing a given workload of a Deep Neural Network (DNN).

For example, a memory fetch instruction (e.g., a load instruction) can be configured to specify a memory address in the random access memory 105, a local address in the local memory 115, and a size of a data item to be loaded from the memory address to the local address. The execution of a fetch instruction causes the data item to be loaded into the local memory 115 at the local address. For example, the local memory 115 can be a register file or local Static Random-Access Memory (SRAM) of a processing unit 111.

A fetch tracker can be configured to store memory fetch instructions that have already loaded in the Deep Learning Accelerator 103 for subsequent execution. Based on the memory addresses, local addresses, and sizes of the items to be fetched via the fetch instructions, the fetch tracker can determine whether a data item being fetched via one fetch instruction is to be fetched again in a subsequent fetch instruction.

Further, a memory fetch instruction can include a set of hint bits representative of a hint of the type and processing pattern of the data item that is being fetched via the instruction. For example, the hint bits of the memory fetch instruction can be set by the compiler 203 to indicate to the fetch tracker a type or characteristics of dataflow in the processing of the Artificial Neural Network 201 involving the data item being fetched. For example, the hint bits can indicate whether the data item is instructions or matrices of the Artificial Neural Network 201. If the data item being fetched is a matrix of the Artificial Neural Network 201, the hint bits can indicate whether the processing involving the matrix is weight stationary, output stationary, input stationary, or row stationary in dataflow, as further discussed below.

When a memory fetch instruction is to be executed, the fetch tracker determines whether the data item is already cached in the system buffer. If so, the data item cached in the system buffer is fetched into the local memory 115 according to the local address specified in the memory fetch instruction. Otherwise, the Deep Learning Accelerator 103 uses the memory interface 117 to access the random access memory 105 to fetch the data item from the memory address specified in the memory fetch instruction.

If the fetch tracker determines the data item will be requested again via a subsequent memory fetch instruction stored in the fetch tracker, the data item is cached in the system buffer and routed to the destination identified by the local address specified in the fetch instruction currently being executed.

If the fetch tracker determines the data item is not requested again via any subsequent memory fetch instruction currently stored in the fetch tracker, the fetch tracker checks the request type and hint bits to determine whether to cache the data item.

If the data being fetched is a set of instructions, the set of instructions can be routed directly to the destination identified by the local address without being cached in the system buffer.

If the data being fetched is matrices 207 of the Artificial Neural Network (e.g., kernel/maps data), the fetched data may be cached in the system buffer depending on the type of algorithm or processing method used to implement the computation of the associated layer of artificial neurons and the availability of storage capacity in the system buffer.

For example, the type of algorithm used to process the associated layer of artificial neurons can be known to the compiler 203 in generating the instructions 205 for the Deep Learning Accelerator 103. Thus, the compiler can identify the type of algorithm using the hint bits in the fetch instructions.

For example, algorithms used to process a layer of artificial neurons can be classified or characterized as Weight Stationary, Output Stationary, Input Stationary, or Row stationary.

In a computation characterized as Weight Stationary, the weight data of artificial neurons can be loaded and cached in the local memory 115 of a processing unit 111 for use in multiple operations performed by the processing unit 111. Thus, it is not necessary to cache the weight data in the system buffer; and the capacity of the system buffer can be used more efficiently for other types of data that may be re-fetched more frequently. Input 211 to the artificial neurons is likely to be reused. Thus, it is desirable to cache the input 211 in the system buffer for improved performance in accessing the input 211 to the artificial neurons.

In a computation characterized as Input Stationary, the input 211 to artificial neurons can be loaded and cached in the local memory 115 of a processing unit 111 for use in multiple operations performed by the processing unit 111. Thus, it is not necessary to cache the input data in the system buffer; and the capacity of the system buffer can be used more efficiently for other types of data that may be re-fetched more frequently. The weight data of artificial neurons is likely to be reused. Thus, it is desirable to cache the weight data in the system buffer.

In a computation characterized as Output Stationary, a processing unit 111 can perform multiple operations to compute the output 213 of a same set of artificial neurons. However, neither the input 211 nor the weight data is stationary in the local memory 115 of the processing unit 111. Thus, it is desirable to cache in the system buffer both the input 211 and the weight data. However, when there is insufficient storage capacity in the system buffer, caching the weight data has priority over caching the input data, because the input data loaded in the local memory of a processing unit 111 can be partially reused.

In a computation characterized as Row Stationary, no reusability of input 211 and weight data loaded in the local memory 115 of a processing unit 111 is expected. Thus, it is desirable to cache in the system buffer both the input 211 and the weight data; and no preference is given to any type of data when there is insufficient storage capacity in the system buffer.

Figure 6:
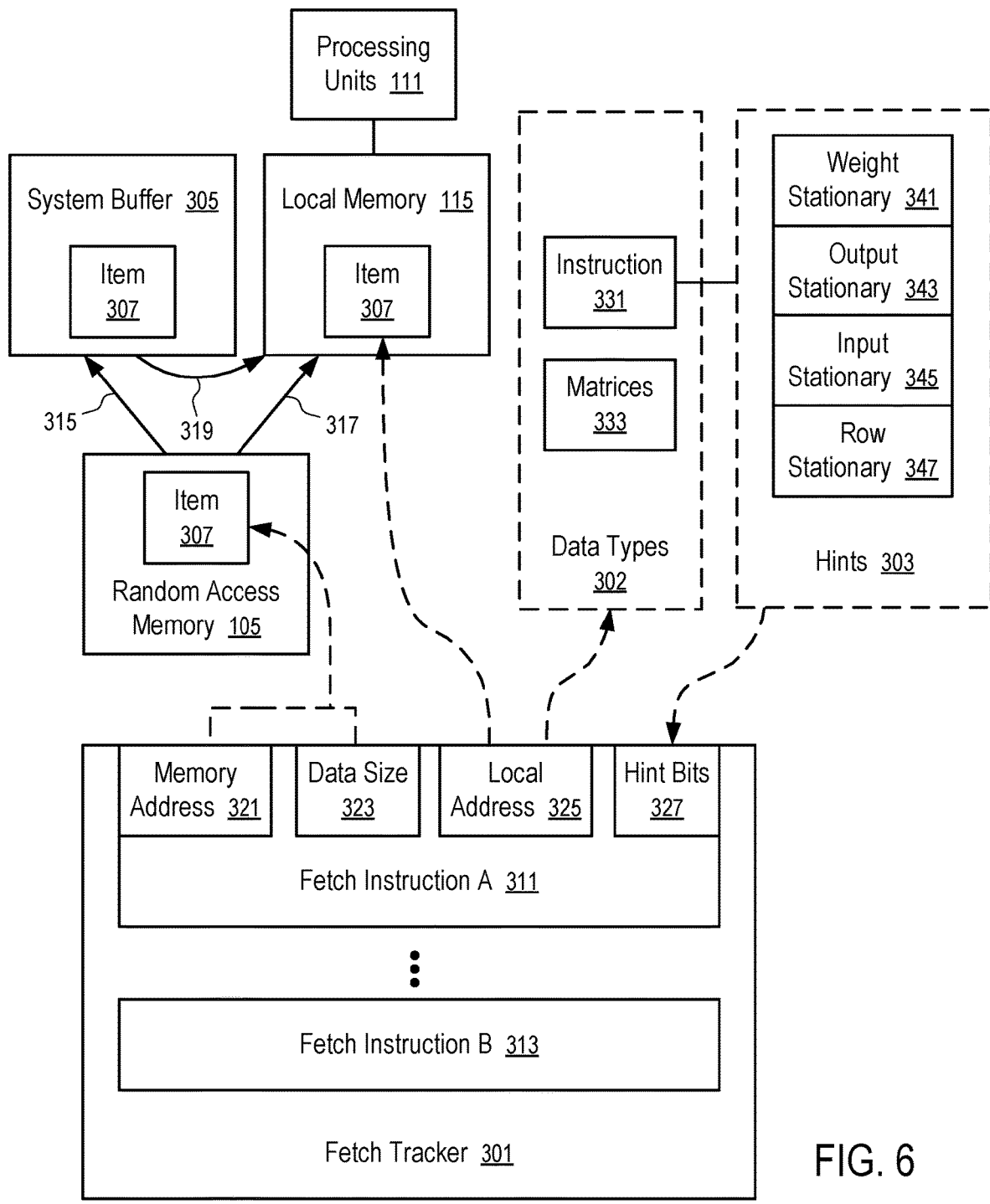
FIG. 6 shows a system to cache data for a Deep Learning Accelerator according to one embodiment.

FIG. 6 shows a system to cache data for a Deep Learning Accelerator according to one embodiment. The system of FIG. 6 can be implemented in the integrated circuit device 101 of FIG. 1 and/or in a computing system of FIG. 5.

For example, a fetch tracker 301 can be implemented in the memory interface 117 of the Deep Learning Accelerator 103 of FIG. 1; and a system buffer 305 can be implemented between the random access memory 105 and the local memory 115 of processing units 111 of the Deep Learning Accelerator 103 of FIG. 1.

After a block of instructions 205 are loaded into the Deep Learning Accelerator 103 for execution, the fetch tracker 301 can store the fetch instructions 311, . . . , 313 found in the block of instructions 205.

A typical fetch instruction 311 is configured to identify a memory address 321 in the random access memory 105, a data size 323 of an item 307 to be fetched, and a local address 325 in the local memory 115 in the Deep Learning Accelerator 103. In response to the fetch instruction 311, the item 307 is to be loaded into the local memory 115 at the local address 325 specified in the fetch instruction 311. The processing units 111 of the Deep Learning Accelerator 103 perform operations using the item 307 in the local memory 115.

When the item 307 requested by the instruction 311 is already cached in the system buffer 305, the fetch instruction 311 can be executed by loading 319 the item 307 from the system buffer 305 into the local memory 115, which is faster than loading 317 the item 307 from the random access memory 105.

If the item 307 is not already in the system buffer 305, the item 307 is to be retrieved from the random access memory 105 at the memory address 321. The item 307 may be selectively cached into the system buffer 305.

For example, when the fetch tracker 301 determines that another fetch instruction 313 to be executed after the instruction 311 requests the same item 307 from the memory address 321, caching 315 of the item 307 is performed such that the request for the item 307 in the instruction 313 can be fulfilled using the system buffer 305, instead of the random access memory 105, to improve the speed in completing the instruction 313.

However, if none of the instructions stored in the fetch tracker 301 requests the item 307, it is possible that the item 307 is requested in a further instruction that is not yet stored into the fetch tracker 301. In such a situation, the caching 315 of the item 307 can be selectively performed based on the data type of the item 307 and/or the hint bits 327 provided in the fetch instruction 311.

The data type of the item 307 can be one of a predetermined set of data types 302.

In one implementation, the data type of the item 307 is inferred from the local address 325. For example, if the item 307 is to be loaded into a local memory 115 configured to store instructions to be executed by the Deep Learning Accelerator 103, the item 307 can be determined to have the data type of instruction 331; otherwise, the item 307 can be determined to have the data type of matrices 333 of a set of artificial neurons. A matrix associated with a set of artificial neurons can be representative of weight data of the artificial neurons, or the input 211 to the set of artificial neurons.

Alternatively, the data type of the item 307 can be specified by the compiler 203 using a portion of the hint bits 327 provided in the fetch instruction 311.

The hint bits 327 can be used to further identify a pattern of computations performed for the Artificial Neural Network 201 using the item 307. For example, the hint bits 327 can be used to identify one of a predefined set of hints 303, including weight stationary 341, output stationary 343, input stationary 345, and row stationary 347.

Based on the data type of the item 307 and/or the pattern of computation involving the item 307, the caching 315 of the item 307 in the system buffer 305 can be selectively performed to optimize the use of the storage capacity of the system buffer 305.

For example, weight stationary 341 can be used by the compiler 203 to indicate the preference to use the system buffer 305 to cache input 211 but not to cache weight data.

For example, input stationary 345 can be used by the compiler 203 to indicate the preference to use the system buffer 305 to cache weight data but not to cache input 211.

For example, output stationary 343 can be used by the compiler 203 to indicate the preference to use the system buffer 305 to cache both weight data and input 211 with priority for the weight data.

For example, row stationary 347 can be used by the compiler 203 to indicate the preference to use the system buffer 305 to cache both weight data and input 211 without giving priority to either the weight data or the input 211.

FIGS. 7-11 illustrate examples of caching data according to data type for a Deep Learning Accelerator according to one embodiment.

In FIGS. 7-11, at the time of the execution of the fetch instruction 311, the system buffer 305 is not already storing the item 307 requested by the instruction 311. Further, the fetch tracker 301 is not storing a further fetch instruction that requests the same item 307. Thus, the fetch tracker 301 checks the data type of the item 307 and/or the hint bits 327 to identify a way to load the item 307 requested by the instruction 311.

Figure 7:
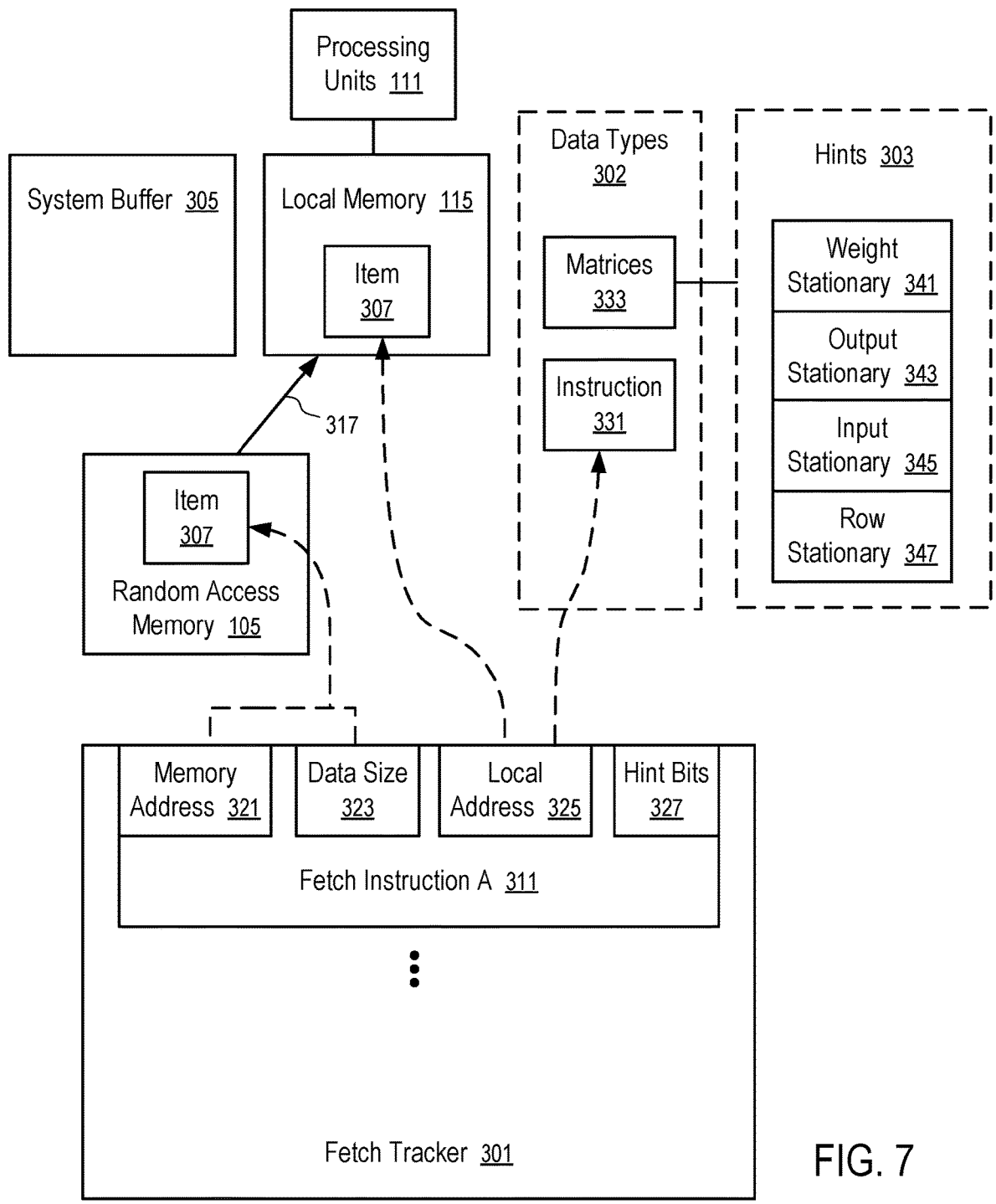
FIGS. 7-11 illustrate examples of caching data according to data type for a Deep Learning Accelerator according to one embodiment.

In FIG. 7, the date item 307 is determined to have a type of instruction 331. Since the fetch tracker 301 is not storing a further fetch instruction that requests the instructions represented by the data item 307, the fetch instruction 311 is executed by loading the item 307 from the memory address 321 in the random access memory 105 to the local memory 115, bypassing the system buffer 305 and skipping the caching of the item 307.

In FIGS. 8-11, the date item 307 requested in the fetch instruction 311 is determined to have a type of matrices 333. The data item 307 can contain input 211 to respective artificial neurons and/or weights 309 to be applied by the respective artificial neurons to the input 211. The fetch tracker 301 is not storing a further fetch instruction that requests the instructions represented by the data item 307.

Figure 8:
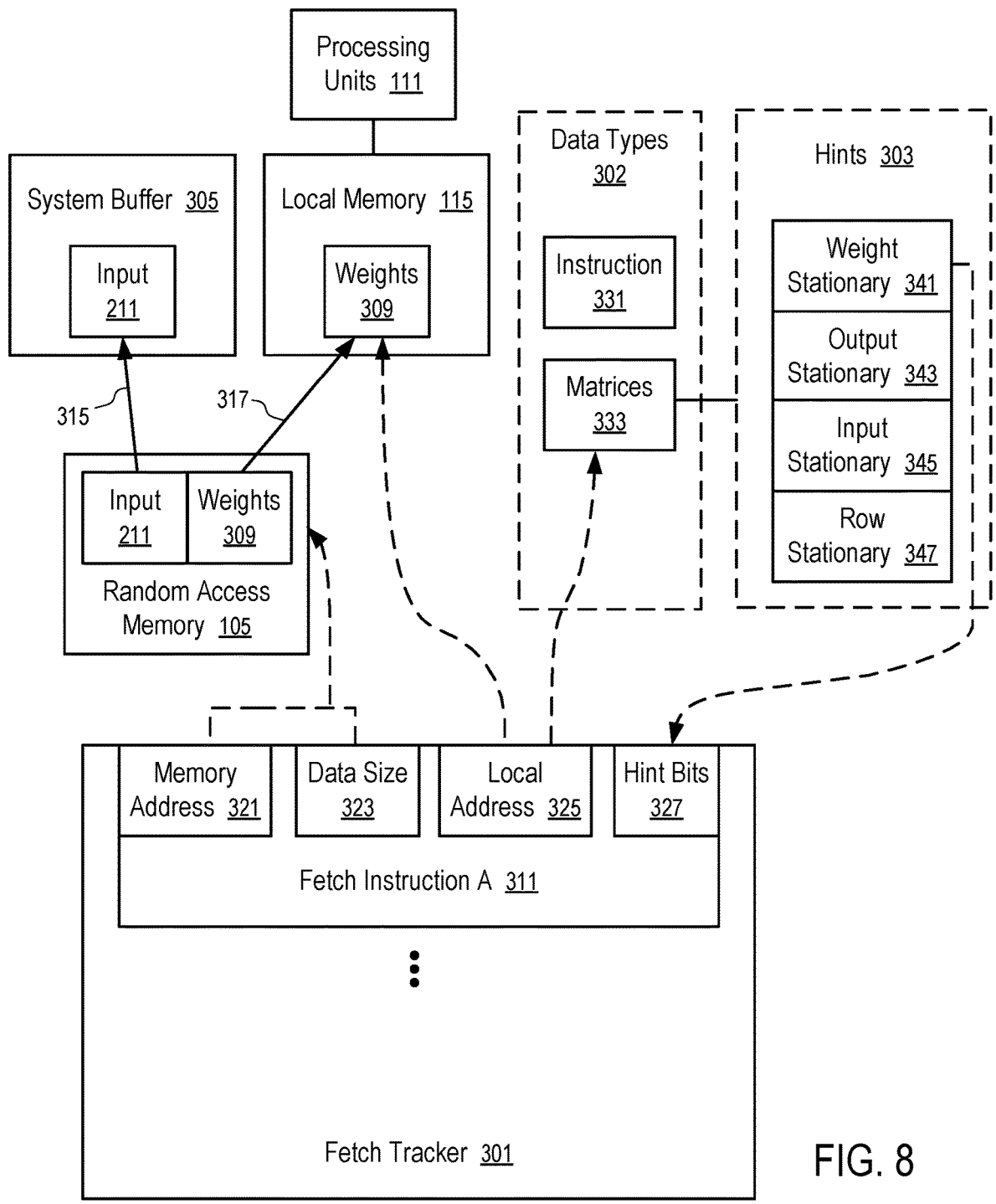

In FIG. 8, since the hint bits 327 of the instruction 311 indicate the preference to cache weights 309 but not input 211, loading 317 of the weights 309 is performed from the random access memory 105 into the local memory 115, by passing the system buffer 305; and caching 315 of the input 211 is performed. After the input 211 is in the system buffer 305, the loading 319 of the input 211 can then be performed from the system buffer 305.

Figure 9:
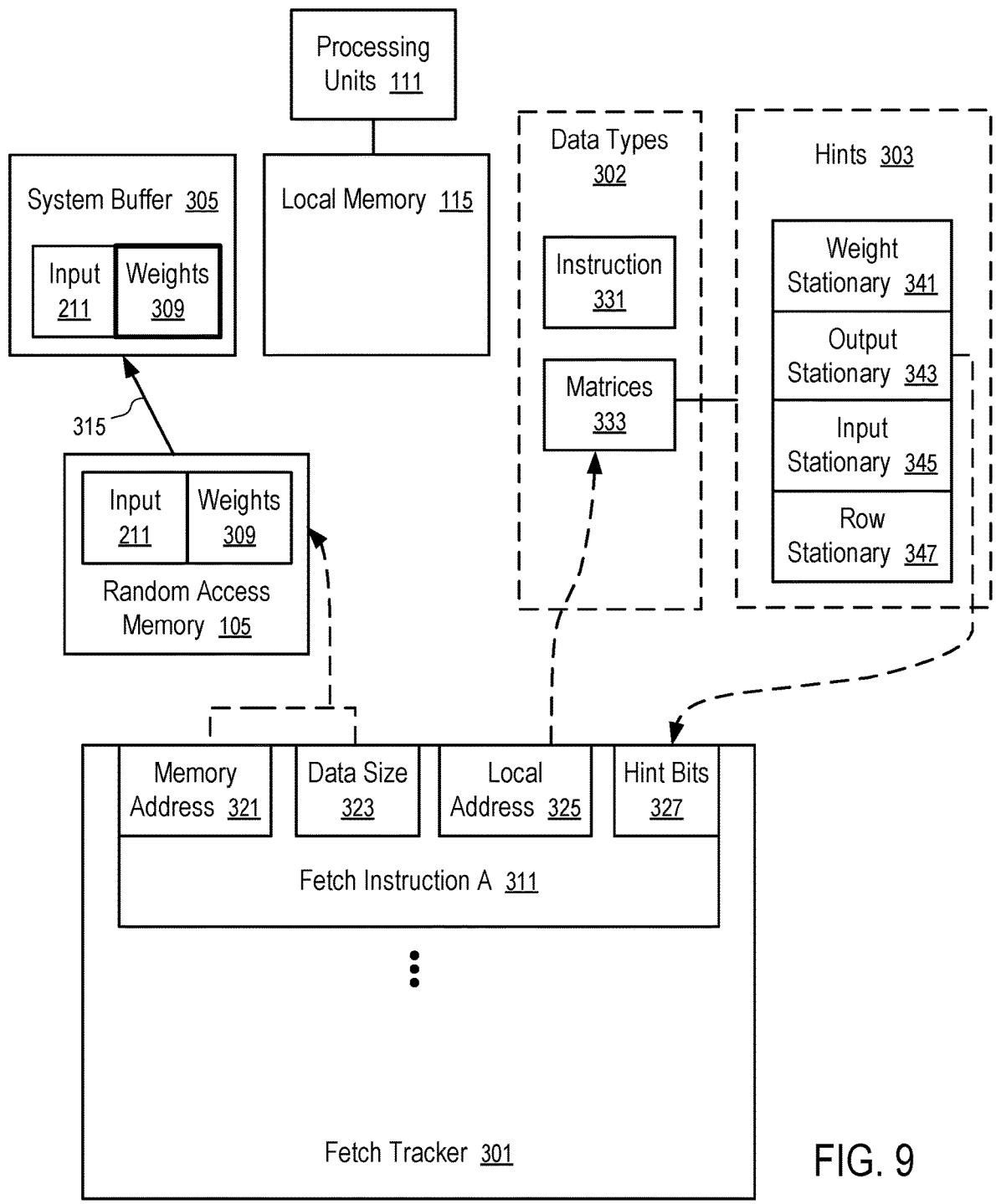

In FIG. 9, since the hint bits 327 of the instruction 311 indicate the preference to cache weights 309 and input 211, caching 315 of the data item 307 requested in the fetch instruction 311 is attempted. If the system buffer 305 has sufficient storage space, both weights 309 and input 211 can be cached in the system buffer 305 for loading into the local memory 115.

However, in FIG. 9, when the system buffer 305 does not have sufficient storage space, the caching of the input 211 can be skipped to avoid the need to evict other data currently cached in the system buffer 305; and in such a situation, loading 317 of the input 211 can be performed directly from the random access memory 105, bypassing the system buffer 305.

If, in FIG. 9, the system buffer 305 does not have sufficient free space to cache the weights 309, a portion of existing data currently cached in the system buffer 305 can be evicted to free up a portion of the storage capacity of the system buffer 305. The weights 309 can be load to the local memory 115 via caching 315 copy of it in the system buffer 305.

Figure 10:
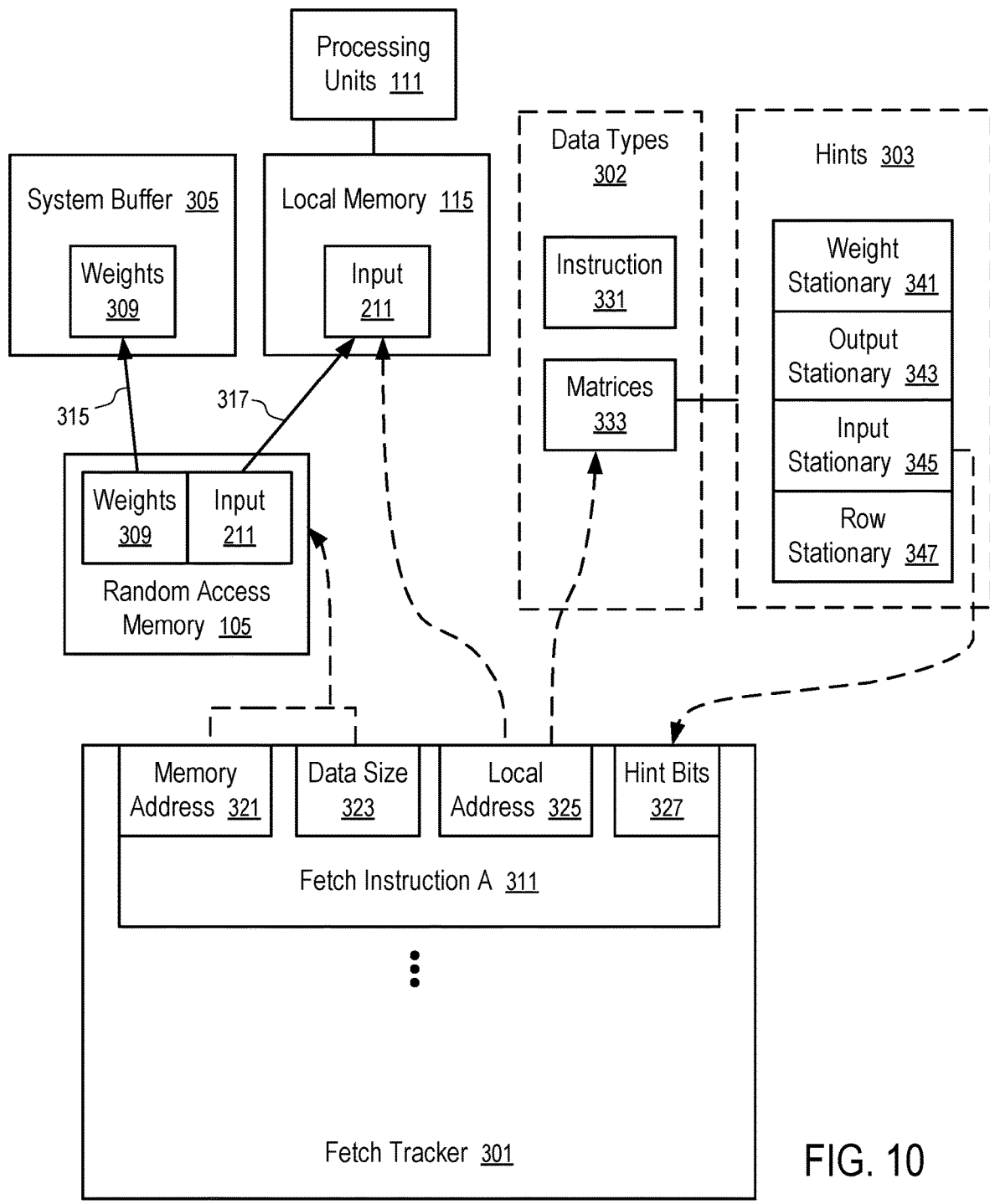

In FIG. 10, since the hint bits 327 of the instruction 311 indicate the preference to cache weights 309 but not input 211, loading 317 of the input 211 is performed from the random access memory 105 into the local memory 115, by passing the system buffer 305; and caching 315 of the weights 309 is performed. After the weights 309 is in the system buffer 305, the loading 319 of the weights 309 can then be performed from the system buffer 305.

Figure 11:
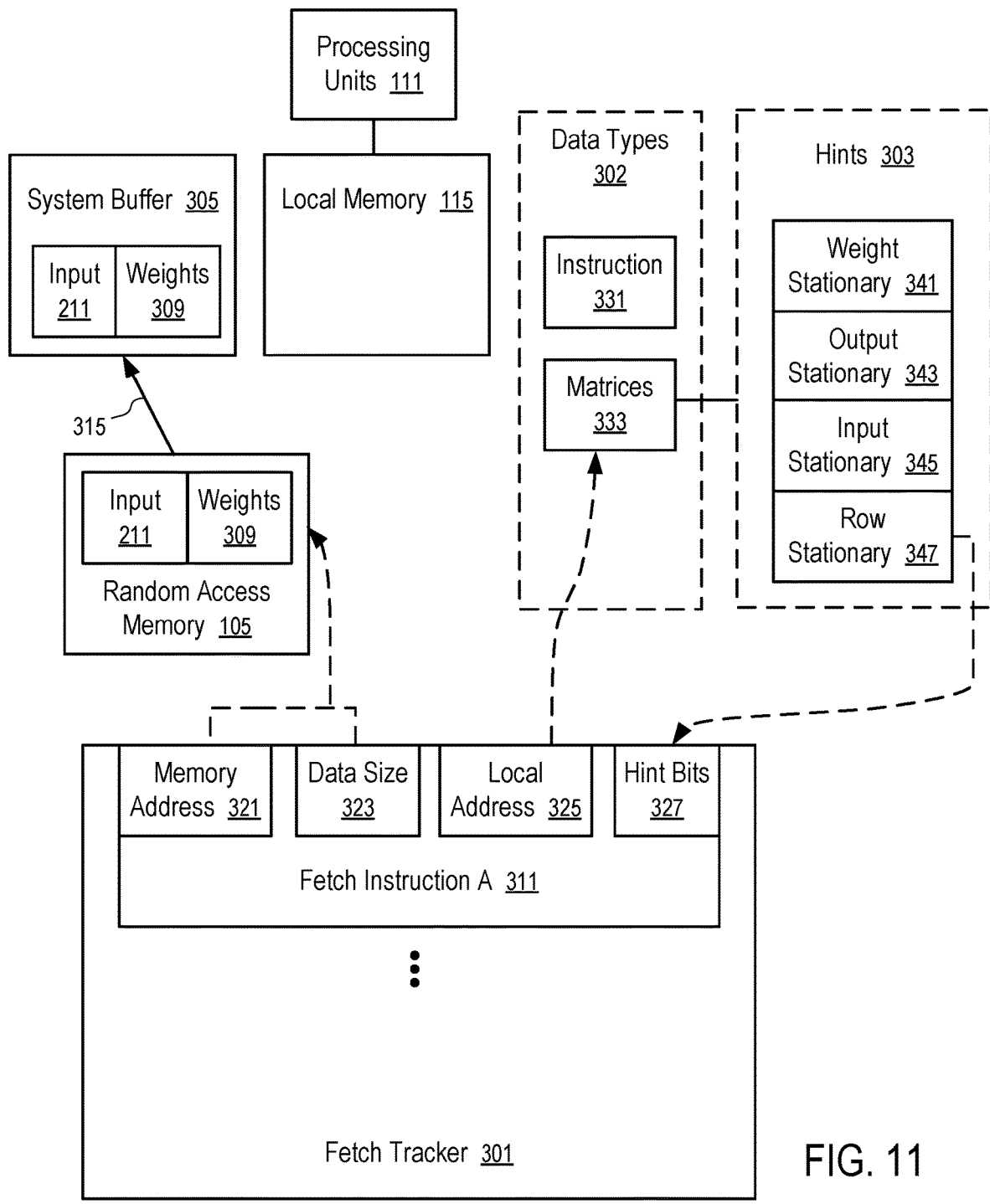

In FIG. 11, since the hint bits 327 of the instruction 311 indicate the preference to cache weights 309 and input 211, caching 315 of the data item 307 requested in the fetch instruction 311 is attempted. If the system buffer 305 has sufficient storage space, both weights 309 and input 211 can be cached in the system buffer 305 for loading into the local memory 115.

However, in FIG. 11, when the system buffer 305 does not have sufficient storage space, the caching of the input 211 and/or the weights 309 can be skipped to avoid the need to evict other data currently cached in the system buffer 305; and in such a situation, loading 317 of the input 211 and/or the weights can be performed directly from the random access memory 105, bypassing the system buffer 305.

Figure 12:
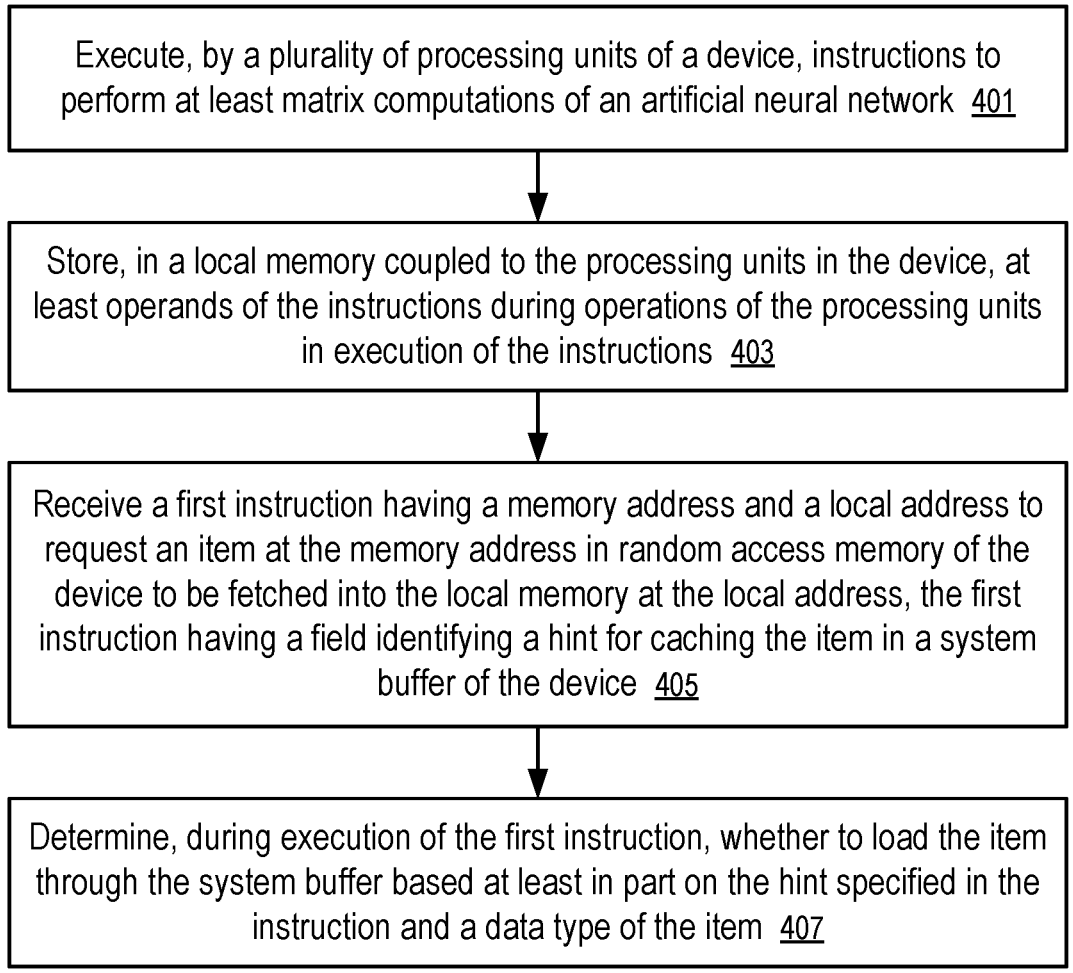
FIG. 12 shows a method of caching data for a Deep Learning Accelerator according to one embodiment.

FIG. 12 shows a method of caching data for a Deep Learning Accelerator according to one embodiment. For example, the method of FIG. 12 can be implemented in the integrated circuit device 101 of FIG. 1 or another device similar to that illustrated in FIG. 5. For example, the method of FIG. 12 can be implemented using software-managed or instruction-managed buffers, or using hardware-managed caches.

At block 401, a plurality of processing units 111 of a device 101 executes instructions 205 to perform at least matrix computations of an artificial neural network 201.

For example, the device 101 can include a Deep Learning Accelerator 103 formed on a Field-Programmable Gate Array (FPGA) or Application Specific Integrated circuit (ASIC). The Deep Learning Accelerator 103 has a memory interface 117, the processing units 111, a control unit 113 and a local memory 115.

For example, the processing units 111 can include a matrix-matrix unit 121, a matrix-vector unit 141, and/or a vector-vector unit 161. The instructions 205 can be generated by a compiler 203 of an artificial neural network 201 to implement the computations of the artificial neural network 201 in generating an output 213 for an input 211 to the artificial neural network 201.

At block 403, a local memory 115 coupled to the processing units 111 in the device 101 can store at least operands of the instructions 205 during the operations of the processing units 111 in execution of the instructions 205.

For example, the local memory 115 can include one or more register files and/or local Static Random-Access Memory (SRAM) of the processing units 111. For example, the local memory 115 can include the maps banks 151, . . . , 153, kernel buffers 131, . . . , 133, and/or vector buffers 181, . . . , 183 illustrated in FIGS. 2 to 4.

For example, fetch instructions (e.g., 311, . . . , 313) can be executed via the memory interface 117 to load a portion of instructions 205 and data (e.g., matrices 207 and input 211) of the artificial neural network 201 into the local memory 115 for execution by the processing units 111. The instructions 205 can include the fetch instructions (e.g., 311, . . . , 313).

At block 405, the Deep Learning Accelerator 103 receives a first instruction 311 having a memory address 321 and a local address 325. The first instruction 311 requests an item 307, available at the memory address 321 in the random access memory 105 of the device 101, to be fetched into the local memory 115 at the local address 325. The first instruction 311 further has a field (e.g., hint bits 327) that identifies a hint for caching the item 307 in a system buffer 305 of the device 101.

For example, the system buffer 305 can be configured such that loading data from the system buffer 305 to the local memory 115 is faster than loading the data from the random access memory 105. The system buffer 305 can be used to cache a portion of data available in the random access memory 105. Optimizing the use of the storage capacity of the system buffer 305 can improve the computation performance of the device 101. The hint provided in the first instruction 311 can improve the use of the storage capacity of the system buffer 305.

At block 407, during execution of the first instruction 311, the memory interface 117 determines whether to load the item 307 through the system buffer 305 based at least in part on the hint specified in the first instruction 311 and a data type of the item 307.

For example, the data type of the item 307 can be representative of weights of artificial neurons in the artificial neural network, or representative of inputs to the artificial neurons in the artificial neural network.

In some instances, whether to load the item 307 through the system buffer 305 is further based on the availability of free space in the system buffer 305 to cache the item 307 without evicting data currently cached in the system buffer 305.

For example, prior to the determining of whether to load the item 307 through the system buffer 305, the memory interface 117 can determine whether the item 307 is already cached in the system buffer 305; and if so, the item 307 is loaded into the local memory 115 from the system buffer 305 without reading the random access memory 105. Otherwise, the memory interface 117 can further determine if the item 307 is to be again requested by a second instruction 313 that has already been loaded into the Deep Learning Accelerator 103 and that is to be executed after the first instruction 311. If so, caching of the item 307 is desirable; and the item 307 can be loaded into the local memory 115 through the system buffer 305 without checking the hint bits 327 of the instructions. Otherwise, the memory interface 117 can further determine if the item 307 is a set of instructions to be executed by the processing units. If so, the set of instructions can be loaded into the local memory 115 from the random access memory 105 without going through the system buffer 305 and without checking the hint bits. Otherwise, the hint bits 327 are checked to determine whether to load the item 307 through the system buffer 305.

For example, when the hint bits 327 have a first value, the item 307 is loaded from the random access memory 105 to the local memory 115: without going through the system buffer 305, in response to a determination that the item 307 has a first type; or through the system buffer 305, in response to a determination that the item 307 has a second type.

For example, the first value can be an indication that a method of weight stationary 341 is used to compute the response of a set of artificial neurons to inputs. Thus, the item 307 of the first type containing data representative of weights 309 of artificial neurons in the artificial neural network 201 is loaded into the local memory 115 in a way that bypasses the system buffer 305; and in contrast, the item 307 of the second type containing data representative of inputs 211 to the artificial neurons in the artificial neural network 201 is loaded through the system buffer 305 and thus cached in the system buffer 305 for subsequent reuse.

In another example, the first value can be an indication that a method of input stationary 345 is used to compute responses of different sets of artificial neurons to an input 211. Thus, the item 307 of the second type containing data representative of weights 309 of artificial neurons in the artificial neural network 201 is loaded through the system buffer 305 and thus cached in the system buffer 305 for subsequent reuse; and in contrast, the item 307 of the first type containing data representative of inputs 211 to the artificial neurons in the artificial neural network 201 is loaded into the local memory 115 in a way that bypasses the system buffer 305.

However, in the example, when the hint bits 327 have a second value, the item 307 can be loaded from the random access memory 105 to the local memory 115 differently, based on the type of the item 307 and the availability of free space in the system buffer 305. For example, the second value can be an indication that a method of output stationary 343 is used to process the artificial neural network 201. Thus, the item 307 of the second type containing data representative of weights 309 of artificial neurons in the artificial neural network 201 is loaded through the system buffer 305 and thus cached in the system buffer 305 for subsequent reuse; and in contrast, the item 307 of the first type containing data representative of inputs 211 to the artificial neurons in the artificial neural network 201 is loaded into the local memory 115 in a way that bypasses the system buffer 305 if the system buffer 305 has insufficient capacity to cache the item 307 without evicting data currently cached in the system buffer, but through the system buffer 305 if the system buffer 305 has sufficient capacity to cache the item 307 without evicting data currently cached in the system buffer 305.

Further, in the example, when the hint bits 327 have a third value, the item 307 can be loaded from the random access memory 105 to the local memory 115 differently, based on the availability of free space in the system buffer 305 for both the first and second types of items. For example, the third value can be an indication that a method of row stationary 347 is used to process the artificial neural network 201. Thus, the item 307, of the first type or the second type, is loaded into the local memory 115 in a way that bypasses the system buffer 305 if the system buffer 305 has insufficient capacity to cache the item 307 without evicting data currently cached in the system buffer, but through the system buffer 305 if the system buffer 305 has sufficient capacity to cache the item 307 without evicting data currently cached in the system buffer 305.

Further, in the example, when the hint bits 327 have a fourth value that can cause the item 307 to be loaded from the random access memory 105 to the local memory 115 differently. For example, the fourth value can be an indication that a method of weight stationary 341 is used to process the artificial neural network 201. Thus, the item 307 of the second type containing data representative of weights 309 of artificial neurons in the artificial neural network 201 is loaded into the local memory 115 in a way that bypasses the system buffer 305; and in contrast, the item 307 of the first type containing data representative of inputs 211 to the artificial neurons in the artificial neural network 201 is loaded through the system buffer 305 and thus cached in the system buffer 305 for subsequent reuse.

The present disclosure includes methods and apparatuses which perform the methods described above, including data processing systems which perform these methods, and computer readable media containing instructions which when executed on data processing systems cause the systems to perform these methods.

A typical data processing system can include an inter-connect (e.g., bus and system core logic), which interconnects a microprocessor(s) and memory. The microprocessor is typically coupled to cache memory.

The inter-connect interconnects the microprocessor(s) and the memory together and also interconnects them to input/output (I/O) device(s) via I/O controller(s). I/O devices can include a display device and/or peripheral devices, such as mice, keyboards, modems, network interfaces, printers, scanners, video cameras and other devices known in the art. In one embodiment, when the data processing system is a server system, some of the I/O devices, such as printers, scanners, mice, and/or keyboards, are optional.

The inter-connect can include one or more buses connected to one another through various bridges, controllers and/or adapters. In one embodiment the I/O controllers include a USB (Universal Serial Bus) adapter for controlling USB peripherals, and/or an IEEE-1394 bus adapter for controlling IEEE-1394 peripherals.

The memory can include one or more of: ROM (Read Only Memory), volatile RAM (Random Access Memory), and non-volatile memory, such as hard drive, flash memory, etc.

Volatile RAM is typically implemented as dynamic RAM (DRAM) which requires power continually in order to refresh or maintain the data in the memory. Non-volatile memory is typically a magnetic hard drive, a magnetic optical drive, an optical drive (e.g., a DVD RAM), or other type of memory system which maintains data even after power is removed from the system. The non-volatile memory can also be a random access memory.

The non-volatile memory can be a local device coupled directly to the rest of the components in the data processing system. A non-volatile memory that is remote from the system, such as a network storage device coupled to the data processing system through a network interface such as a modem or Ethernet interface, can also be used.

In the present disclosure, some functions and operations are described as being performed by or caused by software code to simplify description. However, such expressions are also used to specify that the functions result from execution of the code/instructions by a processor, such as a microprocessor.

Alternatively, or in combination, the functions and operations as described here can be implemented using special purpose circuitry, with or without software instructions, such as using Application-Specific Integrated Circuit (ASIC) or Field-Programmable Gate Array (FPGA). Embodiments can be implemented using hardwired circuitry without software instructions, or in combination with software instructions. Thus, the techniques are limited neither to any specific combination of hardware circuitry and software, nor to any particular source for the instructions executed by the data processing system.

While one embodiment can be implemented in fully functioning computers and computer systems, various embodiments are capable of being distributed as a computing product in a variety of forms and are capable of being applied regardless of the particular type of machine or computer-readable media used to actually effect the distribution.

At least some aspects disclosed can be embodied, at least in part, in software. That is, the techniques can be carried out in a computer system or other data processing system in response to its processor, such as a microprocessor, executing sequences of instructions contained in a memory, such as ROM, volatile RAM, non-volatile memory, cache or a remote storage device.

Routines executed to implement the embodiments can be implemented as part of an operating system or a specific application, component, program, object, module or sequence of instructions referred to as "computer programs." The computer programs typically include one or more instructions set at various times in various memory and storage devices in a computer, and that, when read and executed by one or more processors in a computer, cause the computer to perform operations necessary to execute elements involving the various aspects.

A machine readable medium can be used to store software and data which when executed by a data processing system causes the system to perform various methods. The executable software and data can be stored in various places including for example ROM, volatile RAM, non-volatile memory and/or cache. Portions of this software and/or data can be stored in any one of these storage devices. Further, the data and instructions can be obtained from centralized servers or peer to peer networks. Different portions of the data and instructions can be obtained from different centralized servers and/or peer to peer networks at different times and in different communication sessions or in a same communication session. The data and instructions can be obtained in entirety prior to the execution of the applications. Alternatively, portions of the data and instructions can be obtained dynamically, just in time, when needed for execution. Thus, it is not required that the data and instructions be on a machine readable medium in entirety at a particular instance of time.

Examples of computer-readable media include but are not limited to non-transitory, recordable and non-recordable type media such as volatile and non-volatile memory devices, Read Only Memory (ROM), Random Access Memory (RAM), flash memory devices, floppy and other removable disks, magnetic disk storage media, optical storage media (e.g., Compact Disk Read-Only Memory (CD ROM), Digital Versatile Disks (DVDs), etc.), among others. The computer-readable media can store the instructions.

The instructions can also be embodied in digital and analog communication links for electrical, optical, acoustical or other forms of propagated signals, such as carrier waves, infrared signals, digital signals, etc. However, propagated signals, such as carrier waves, infrared signals, digital signals, etc. are not tangible machine readable medium and are not configured to store instructions.

In general, a machine readable medium includes any mechanism that provides (i.e., stores and/or transmits) information in a form accessible by a machine (e.g., a computer, network device, personal digital assistant, manufacturing tool, any device with a set of one or more processors, etc.).

In various embodiments, hardwired circuitry can be used in combination with software instructions to implement the techniques. Thus, the techniques are neither limited to any specific combination of hardware circuitry and software nor to any particular source for the instructions executed by the data processing system.

The above description and drawings are illustrative and are not to be construed as limiting. Numerous specific details are described to provide a thorough understanding. However, in certain instances, well known or conventional details are not described in order to avoid obscuring the description. References to one or an embodiment in the present disclosure are not necessarily references to the same embodiment; and, such references mean at least one.

In the foregoing specification, the disclosure has been described with reference to specific exemplary embodiments thereof. It will be evident that various modifications can be made thereto without departing from the broader spirit and scope as set forth in the following claims. The specification and drawings are, accordingly, to be regarded in an illustrative sense rather than a restrictive sense.

What is claimed is:

1. A device, comprising:
   a plurality of processing units configured to execute instructions and perform at least matrix computations of an artificial neural network via execution of the instructions;
   a local memory coupled to the processing units and configured to store at least operands of the instructions during operations of the processing units in execution of the instructions;
   a memory configured as a buffer;
   a random access memory; and
   a logic circuit coupled to the buffer, the local memory, and the random access memory;
   wherein the instructions include a first instruction to fetch an item from the random access memory to the local memory; the first instruction includes a field related to caching the item in the buffer; and during execution of the first instruction the logic circuit is configured to determine whether to load the item through the buffer based at least in part on the field specified in the first instruction.

2. The device of claim 1, wherein whether to load the item through the buffer is further based on a data type of the item.

3. The device of claim 2, wherein a second determination of whether to load the item through the buffer is in response to a first determination that:
   the item is not already cached in the buffer;
   the item is not a set of instructions to be executed by the processing units; and
   second instructions cached in the local memory do not request the data item.

4. The device of claim 3, wherein when the field has a first value, the item is loaded from the random access memory to the local memory:
   without going through the buffer, in response to a determination that the item has a first type; or
   through the buffer, in response to a determination that the item has a second type.

5. The device of claim 4, wherein the item of the first type containing data representative of weights of artificial neurons in the artificial neural network; and the item of the second type containing data representative of inputs to the artificial neurons in the artificial neural network.

6. The device of claim 4, wherein the item of the second type containing data representative of weights of artificial neurons in the artificial neural network; and the item of the first type containing data representative of inputs to the artificial neurons in the artificial neural network.

7. The device of claim 4, wherein when the field has a second value, the item is loaded from the random access memory to the local memory:
   without going through the buffer, in response to a determination that the item has the first type and the buffer has insufficient capacity to cache the item without evicting data currently cached in the buffer;
   through the buffer, in response to a determination that the item has the second type; or
   through the buffer, in response to a determination that the item has the first type and the buffer has sufficient capacity to cache the item without evicting data currently cached in the buffer.

8. The device of claim 7, wherein the item of the second type containing data representative of weights of artificial neurons in the artificial neural network; and the item of the first type containing data representative of inputs to the artificial neurons in the artificial neural network.

9. The device of claim 8, wherein when the field has a third value, the item is loaded from the random access memory to the local memory:
   without going through the buffer, in response to a determination that the buffer has insufficient capacity to cache the item without evicting data currently cached in the buffer; or
   through the buffer, in response to a determination that the buffer has sufficient capacity to cache the item without evicting data currently cached in the buffer.

10. The device of claim 9, wherein when the field has a fourth value, the item is loaded from the random access memory to the local memory:
    without going through the buffer, in response to a determination that the item has the second type, or
    through the buffer, in response to a determination that the item has the first type.

11. An apparatus, comprising:
    a Field-Programmable Gate Array (FPGA) or Application Specific Integrated circuit (ASIC), including:
       a memory interface;
       at least one processing unit configured to operate on two matrix operands of an instruction executed in the FPGA or ASIC; and
       a local memory configured to store operands of the instruction during execution of the instruction;
    a system buffer connected to the memory interface; and
    a random access memory connected to the memory interface;
    wherein in response to a first instruction specifying a memory address, a local address, and a hint, the memory interface is configured to determine, based on the hint, whether to fetch an item, available at the memory address in the random access memory, to the local address in the local memory, through the system buffer.

12. The apparatus of claim 11, wherein whether to load the item through the system buffer is further based on a data type of the item.

13. The apparatus of claim 12, wherein whether to load the item through the system buffer is further based on availability of free space in the system buffer to cache the item without evicting data currently cached in the system buffer.

14. The apparatus of claim 12, wherein the data type is one of:
    representative of weights of artificial neurons in an artificial neural network; and
    representative of inputs to the artificial neurons in the artificial neural network.

15. A method, comprising:
    executing, by a plurality of processing units of a device, instructions to perform at least matrix computations of an artificial neural network;
    storing, in a local memory coupled to the processing units in the device, at least operands of the instructions during operations of the processing units in execution of the instructions;
    receiving a first instruction having a memory address and a local address to request an item at the memory address in a random access memory of the device to be fetched into the local memory at the local address, the first instruction having a field identifying a hint for caching the item in a system buffer of the device; and
    determining, during execution of the first instruction, whether to load the item through the system buffer based at least in part on the hint specified in the first instruction and a data type of the item.

16. The method of claim 15, wherein when the hint has a first value, the item is loaded from the random access memory to the local memory:
   without going through the system buffer, in response to a determination that the item has a first type, or
   through the system buffer, in response to a determination that the item has a second type.

17. The method of claim 16, wherein when the hint has a second value, the item is loaded from the random access memory to the local memory:
   without going through the system buffer, in response to a determination that the item has the first type and the system buffer has insufficient capacity to cache the item without evicting data currently cached in the system buffer;
   through the system buffer, in response to a determination that the item has the second type; or
   through the system buffer, in response to a determination that the item has the first type and the system buffer has sufficient capacity to cache the item without evicting data currently cached in the system buffer.

18. The method of claim 17, wherein the item of the second type containing data representative of weights of artificial neurons in the artificial neural network; and the item of the first type containing data representative of inputs to the artificial neurons in the artificial neural network.

19. The method of claim 18, wherein when the hint has a third value, the item is loaded from the random access memory to the local memory:
   without going through the system buffer, in response to a determination that the system buffer has insufficient capacity to cache the item without evicting data currently cached in the system buffer; or
   through the system buffer, in response to a determination that the system buffer has sufficient capacity to cache the item without evicting data currently cached in the system buffer.

20. The method of claim 19, wherein when the hint has a fourth value, the item is loaded from the random access memory to the local memory:
   without going through the system buffer, in response to a determination that the item has the second type, or
   through the system buffer, in response to a determination that the item has the first type.

\* \* \* \* \*